United States Patent [19]
Cann

[11] Patent Number: 5,182,093
[45] Date of Patent: Jan. 26, 1993

[54] DIAMOND DEPOSITION CELL

[75] Inventor: Gordon L. Cann, Laguna Beach, Calif.

[73] Assignee: Celestech, Inc., Irvine, Calif.

[21] Appl. No.: 462,496

[22] Filed: Jan. 8, 1990

[51] Int. Cl.$^5$ .............................................. C01B 31/00
[52] U.S. Cl. ................... 423/446; 427/228; 427/249
[58] Field of Search .......... 423/446; 427/127.39, 427/249.49, 255.1, 50; 118/724, 725

[56] References Cited

U.S. PATENT DOCUMENTS

| 3,207,582 | 9/1965 | Inoue | 423/446 |
| 3,317,354 | 5/1967 | Darrow et al. | 423/446 |
| 3,818,982 | 6/1974 | Wagner | 118/69 |
| 4,047,496 | 9/1977 | McNeilly et al. | 118/49.1 |
| 4,434,188 | 2/1984 | Kamo | 423/446 |
| 4,534,312 | 8/1985 | Shinya et al. | 118/666 |
| 4,647,512 | 3/1987 | Venkataramanan et al. | 427/39 |
| 4,725,345 | 2/1988 | Sakamoto et al. | 427/38 |
| 4,915,977 | 4/1989 | Okamoto et al. | 427/37 |
| 4,916,291 | 3/1989 | Desphandey et al. | 427/38 |

FOREIGN PATENT DOCUMENTS

| 245688 | 11/1987 | European Pat. Off. | 423/446 |
| 251264 | 1/1988 | European Pat. Off. | 423/446 |
| 3522583 | 2/1986 | Fed. Rep. of Germany | 423/446 |
| 62-216998 | 9/1987 | Japan | 423/446 |

OTHER PUBLICATIONS

Bunshah, "Deposition Technologies for Films and Coatings" Noyes Publications, N.J., 1982 pp. 258–259.
Cann, "Storable Propellant Resistojet Performance Improvement." NASA Contractor Report 182187 2-1 to 2-95.

Primary Examiner—Robert Kunemund

[57] ABSTRACT

In a first embodiment of an improved diamond deposition cell, a chamber is evacuated to a low pressure and a graphite element in the chamber is heated to a selected high temperature and heats a substrate positioned within the chamber spaced by a selected gap from the graphite body to a selected lower temperature. Hydrogen or a mixture of hydrogen and hydrocarbon gas is admitted to the chamber and part of the hydrogen reacts with the hot graphite body to form atomic hydrogen and hydrocarbon gasses. Hydrogen and hydrocarbon gasses cycle repeatedly across the gap between the facing surfaces of the body and the substrate in the kinetic regime resulting in a net transfer of carbon to the substrate and its deposition as diamond crystals or film on the substrate. In a second embodiment, the graphite body is heated by combusting gasses in a cavity therein. Products of such combustion, hydrogen and, optionally, additional hydrocarbon gas are admitted to the gap between the surfaces of the graphite body and the substrate. The temperatures of the facing surfaces, the pressure in the gap and the ratio of the constituent gasses results in carbon atoms being deposited on the substrate in the form of diamond film and other carbon products.

32 Claims, 14 Drawing Sheets

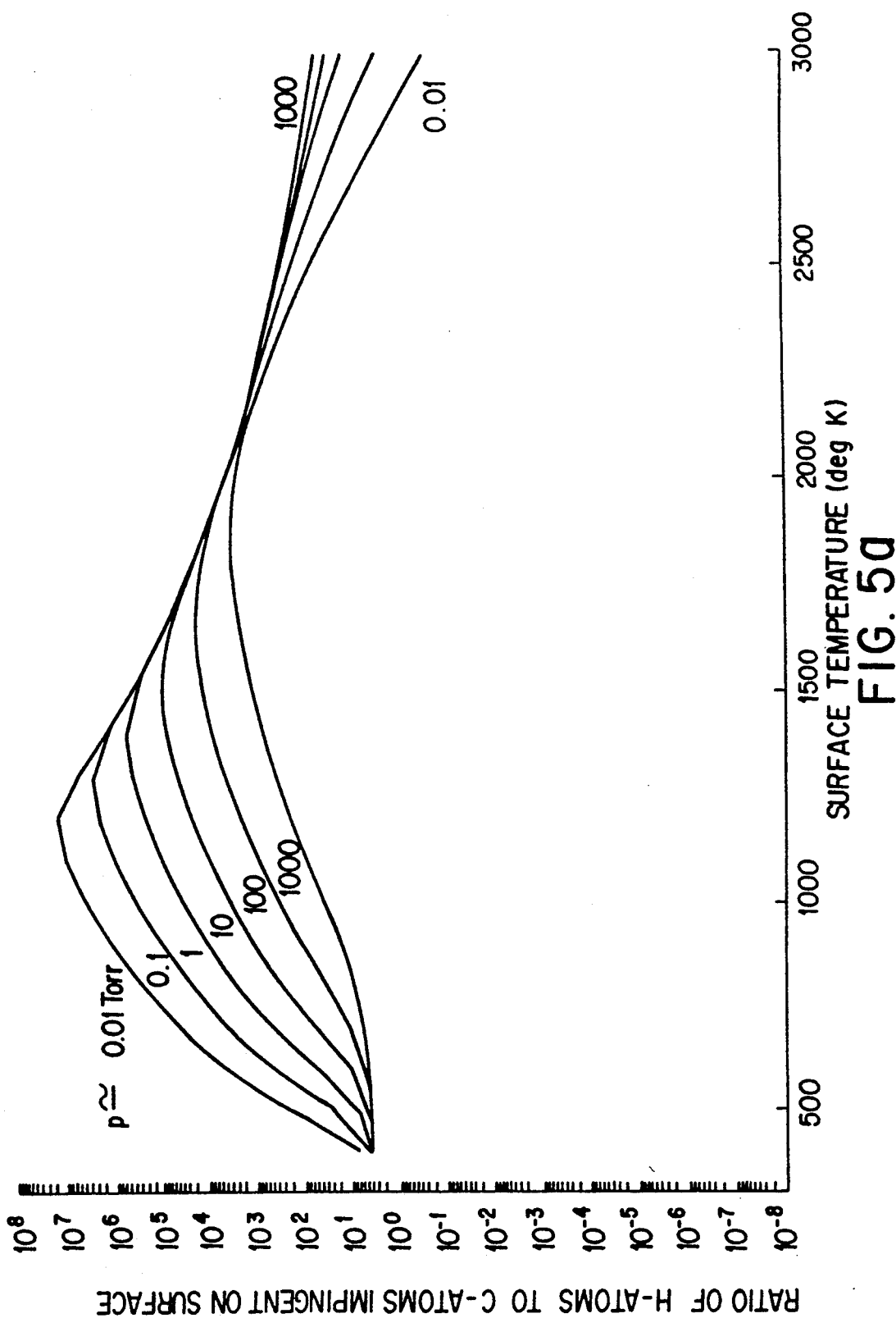

DIAMOND DEPOSITION CELL

BACKGROUND OF THE INVENTION

In the prior art, it is known to deposit diamond films of adequate quality for many commercial applications. An article in *Science* magazine, volume 234, Nov. 18, 1986, pages 1074–1076 describes the state of the art at that time in the development of diamond deposition technology. The article describes the work of an American group at Pennsylvania State University which has deposited polycrystalline diamond films from a mixture of hydrogen and methane on silicon substrates with the aid of a microwave plasma. Apparatus developed in Japan is also discussed in which a tungsten filament is heated to 2,000° C. to excite hydrogen and methane just above a silicon, silica, or molybdenum substrate on which diamond is to be deposited. The mixture of pyrolized methane and atomic hydrogen flows toward the substrate and carbon atoms from the pyrolyzed methane are deposited on the heated substrate to form diamond crystals. Microwave and radio frequency plasmas have also been used as an energy source to dissociate the hydrogen and excite the methane.

In a publication in June, 1986 of the Nippon Institute of Technology, the then current state of the art is described as including the use of the tungsten filament method with silicon substrates and the use of organic hydrocarbon gasses containing oxygen or nitrogen. An example is described wherein acetone is used and polycrystalline films are stated to have grown at a rate of 10 micrometers per hour.

The article also discloses a growth method which is termed remote plasma-enhanced chemical vapor deposition in which a molecular gas is dissociated in a location away from the substrate. The resulting monomers and organic gas then flow through a heated region toward the substrate where pyrolysis and deposition are said to occur.

The above cited *Science* magazine article further states that W. G. Eversole of Union Carbide obtained a patent in 1958 for method of obtaining diamond films from pyrolysis of methane. The process was not commercially attractive because substantial amounts of graphite were deposited along with the diamond so it was necessary to interrupt the growth process periodically to etch away the graphite. A group of scientists at the Institute of Physical Chemistry in Moscow published a paper in 1977 concerning the kinetics of the pyrolysis of hydrocarbons which discussed the concept of a solvent which could prevent the deposition of graphite while not affecting the deposition of diamond. Atomic hydrogen was suggested as the solvent, the same substance used by Eversole as the etchant in his process.

An article in the Oct. 26, 1987 edition of *Electronic Engineering Times*, describes a technique that Fujitsu Ltd. claimed to have developed to produce diamond films by projecting a high density DC plasma against a substrate.

The book *High Temperature Vapors* by John W. Hastie describes a vapor phase/surface reaction mechanism and method of characterizing the total volitization rate from a surface due to evaporation and surface reactions. It further discusses the thermodynamic prediction and experimental verification of gas transport of carbon from a cold to a hot or a hot to a cold surface.

A paper entitled "Hot Filament For Diamond Growth" by Fang and Rhais describes the use of a carbon hot filament in an electromagnetic deposition device. The choice of carbon was made primarily to avoid certain physical metallurgical deficiencies encountered with the more typically used tungsten. The graphite is selected for its presumed stability.

It has recently been shown that diamond can be deposited when the jet from an oxy-acetylene torch is directed toward a cooled substrate, provided the ratio of oxygen and acetylene and the gap between the torch nozzle and the substrate are closely controlled. (See L. M. Hanssen, et al., "Diamond Synthesis Using An Oxygen Acetylene Torch".)

The above techniques for depositing a diamond film all have serious disadvantages. None of them are suitable for depositing diamond films over large areas or over large curved surfaces. Few of them hold any real promise for being sufficiently efficient to make them commercially feasible in most applications. In most instances, the energy and materials costs required to practice the techniques cause the diamond film produced therefrom to be far more expensive than the cost of commercial diamonds as mined or as produced through high pressure and high temperature techniques.

SUMMARY OF THE INVENTION

In accordance with the invention there is provided a method and apparatus for efficiently depositing uniform diamond films on a substrate by positioning the substrate in a transfer cell deposition chamber spaced from the surface of a carbon heater element by a preselected narrow gap, introducing hydrogen into the gap and at a controlled ambient pressure in the gap while maintaining the surface of the carbon heater element at a selected relatively high temperature in the range of 1,800° K. or more and the temperature of the substrate facing the gap at a selected relatively low temperature under 1,500° K. such that thermodynamic kinetic transfer rate of carbon at the surface of the carbon heater element is slightly higher than that at the substrate, and the gas at the substrate surface in slightly supersaturated with carbon. The gap width is preferably maintained at less than about 10 times the mean free path of hydrogen molecules in the gas, and most preferably at about 5 times the mean free path or less so that the movement of atoms and molecules in the gas between the facing surfaces of the heater element and the substrate is predominately in the kinetic regime.

The carbon heater element preferably includes an outer porous graphite wall having an exterior surface forming the gap facing surface and the hydrogen gas is preferably introduced into the gap by diffusion through such wall.

Part of the hydrogen reacts with the carbon present to form hydrocarbon gasses. Another, larger, part of the hydrogen is present as atomic hydrogen. The hydrocarbon formed in the gas at the surface of the heater element is largely acetylene. The acetylene and hydrogen, together with smaller amounts of other hydrocarbon molecules and radicals (e.g. $C_2H_4$ and $CH_3$) and carbon vapor at the surface of the heater element kinetically transit the gap to the substrate where carbon deposits on the substrate partially as diamond and partially as other forms of carbon, such as graphite. Atomic hydrogen in the gas reacts preferentially with the deposited non-diamond carbon to form hydrocarbon gasses, primarily methane, so that only diamond remains on the substrate.

The hydrogen and hydrocarbon gasses at the surface of the substrate then kinetically retransit the gap to the surface of the carbon heater element where the cycle repeats. There is a continuous two way flow of gasses back and forth across the gap between the facing surfaces, with a net deposition of carbon in the form of a growing diamond film on the substrate.

If desired, additional hydrocarbon gas may be mixed with the hydrogen being introduced into the gap in order to speed the deposition process and to extend the life of the carbon heater element. Since it is believed that only a small fraction, perhaps 10%, of the carbon deposited on the substrate is in the form of diamond, it is necessary that sufficient atomic hydrogen be present in the gas impinging the substrate to react with and remove the deposited non-diamond carbon.

While it is theoretically possible to recycle the same hydrogen continuously between the facing surfaces, in order to prevent a build up of contaminants in the system, it is necessary continuously to supply new hydrogen (and hydrocarbon gas, if desired) and to exhaust the mixture of hydrogen and hydrocarbon gas at a rate so as to maintain the desired pressure and purity in the gap.

While the motion of the gas molecules between the facing surfaces is not perfectly kinetic, so long as the gap width is maintained within about 10 times the mean free path, the kinetic effects predominate. The system of the invention can also operated to deposit diamond in the collision dominated regime using larger gap widths and/or high pressures although operation in the kinetic regime is preferred.

An important advantage of the diamond deposition technique of the invention is that uniform films can be deposited over extremely large areas limited only by the size of the deposition chamber and carbon heater element and the ability to maintain gap widths over large areas. Additionally, the technique of the invention is easily capable of deposition of diamond on substrates of various shapes such as, for example, cylinders and domes, for forming curved or shaped diamond films.

In accordance with a further aspect of the invention, the pumping efficiency in exhausting hydrogen gas from the deposition chamber may be substantially increased by including in the deposition chamber a porous graphite reactor maintained at a temperature in the range of about 700° K. to 900° K. for reacting with the hydrogen to convert it to a hydrocarbon gas such as methane which can be pumped from the chamber much more efficiently.

BRIEF DESCRIPTION OF THE DRAWINGS

FIG. 5a is a graph of the ratio of total hydrogen atoms to total carbon atoms including those combined in molecules) impinging on a surface in a carbon box containing hydrogen.

DESCRIPTION OF THE PREFERRED EMBODIMENTS

Figure 1:
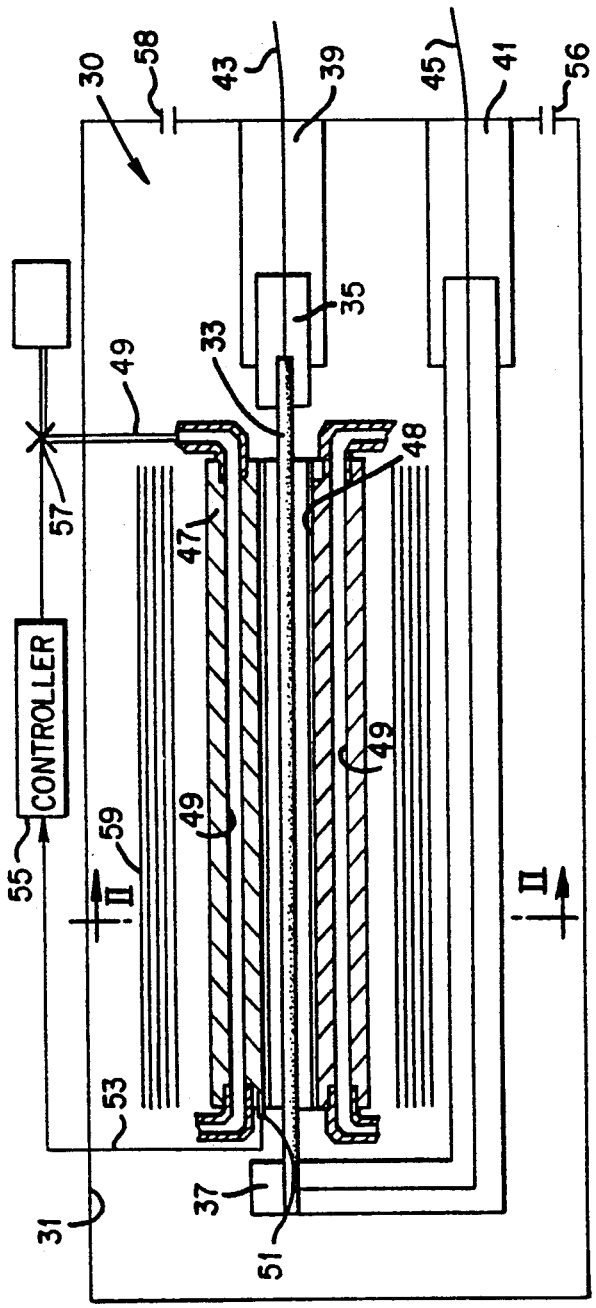
FIG. 1 is a cross-sectional view through a first embodiment of diamond deposition cell in accordance with the invention.

Two versions of a first embodiment of a diamond deposition cell in accordance with the invention are described with reference to FIGS. 1 and 2. Referring first to FIG. 1, a transfer cell 30 includes a vacuum chamber 31 having mounted therein a graphite heater element 33 which in a first version of this embodiment is in the form of a cylindrical graphite rod that is supported within the chamber 31 by supports 35 and 37 that, in turn, are mounted to the walls of the chamber 31 by support blocks 39 and 41. The support block 39 has extending therethrough an electrical conductor 43 which is connected to one end of the element 33, while a further electrical conductor 45 extends through the support block 41 and support 37 to the other end of the element 33 so that the electrical conductors 43 and 45 may be connected to a suitable source of electrical power for heating the element 33 by electrical current.

A substrate holder 47, which in the first version of this embodiment is cylindrical, is mounted in the chamber 31 coaxially with the heater element 33 and has an inner substrate support surface uniformly spaced from the heater element 33 by a gap. The substrate holder 47 includes a plurality of passages 49 therethrough, which are connected by a conduit to a source of coolant gas such as, for example, hydrogen. A cylindrical substrate 48 is positioned in intimate contact with the inner surface of the substrate holder 47. During deposition, the temperature of the surface of the substrate 48 is controlled by sensing the temperature of the substrate holder 47 by the thermocouple 51 or other temperature sensor and supplying sufficient coolant gas to the substrate holder 47 to maintain the temperature at the desired level. The thermocouple 51 is connected to a controller 55 by an wire 53. The controller 55 controls the opening of valve 57 and/or actuation of pump means to control supply of coolant gas through the passages 49.

The vacuum chamber 31 is evacuated through a conduit 56 which is connected to a vacuum pump. Hydrogen, or a mixture of hydrogen and hydrocarbon gas, is supplied to the chamber 31 by means of a conduit 58.

Radiation shields 59 are concentrically mounted about the substrate holder 47 to maintain uniformity of temperature by slowing radiation of heat therefrom.

Figure 2:
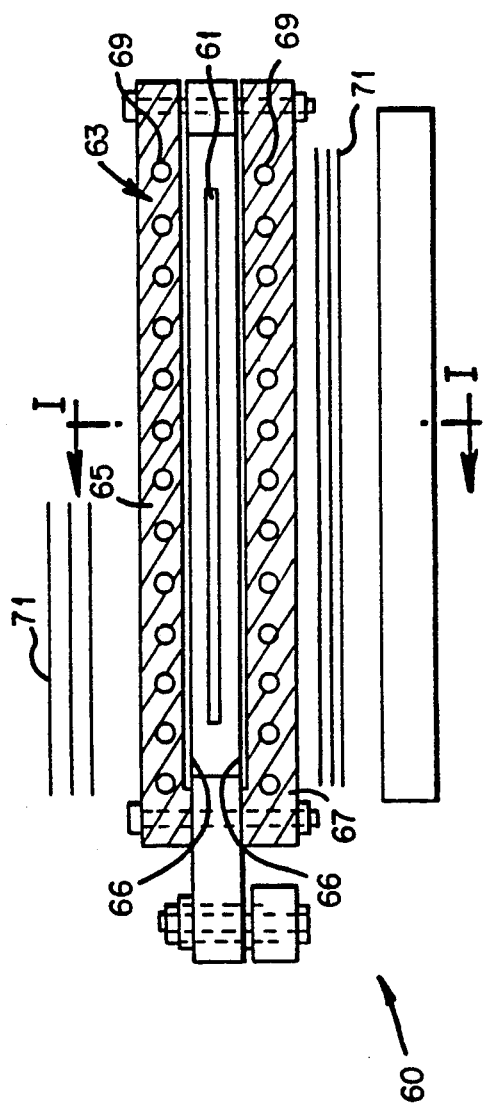
FIG. 2 shows a cross-sectional view through a second version of the embodiment of FIG. 1.

With reference to FIG. 2, a second version of the first embodiment of a deposition cell is illustrated. The cell of FIG. 2, shown in lateral section perpendicular to that of FIG. 1, is identical to the version described above with relation to FIG. 1 except that the graphite heater element 61 in FIG. 2 has a flat, plate-like form and the substrate holder 63 consists of two flat plates 65 and 67 mounted on opposed sides of the heater element 61. Coolant passages 69 are provided to ensure controlled uniform temperature of the substrate holder plates 65 and 67. The radiation shields 59 in the version described with relation to FIG. 1, are substantially cylindrical while, the radiation shields 71 comprise a plurality of stacked flat plates in FIG. 2.

The substrates 66 consist of a thin flat sheet of appropriate material mounted on the inner face of each plate 65, 67.

In operation, the deposition chamber 31 is evacuated to a pressure of about $10^{-3}$ Torr. Hydrogen is admitted to the deposition chamber 31 through the conduit 58 to raise the chamber pressure to a selected pressure preferably between approximately $10^{-1}$ to over 200 Torr although operation of the system for diamond deposition is possible in the range $10^{-10}$ to 1,400 Torr. A working fluid, such as methane ($CH_4$), may also optionally be introduced into the chamber 31 through conduit 58, or from a separate supply in order to establish a ratio of carbon to atomic hydrogen atoms in the input gas stream of about 1 to 10 or less. The maximum ratio of carbon atoms depends on various parameters of the system as is described below.

A working fluid in addition to hydrogen need not be used, since the hydrogen interacts with the hot surface of the graphite heating heater element 33 or 61 to generate hydrocarbon gasses which are kinetically transferred to the surface of the substrate 48 or 66. The substrates 48 or 66 are closely spaced from the surface of the graphite heater element and maintained at a selected temperature lower than that of the graphite heating element. In such case, the hot graphite element acts as the source of carbon for the growing diamond film. Since some of the carbon carried to the substrate by the hydrocarbons (primarily acetylene) leaving the hot element form other hydrocarbons (primarily methane) on the substrate which evaporate, carbon may cycle many times between the two surfaces before entering the growing diamond film. For steady-state operations, it is usually desirable to inject a hydrocarbon gas into the ga between the heater element and the substrate to increase deposition rates and to conserve the graphite heater element 33 or 61.

The graphite heater element 33 or 61 is heated by electrical current to a selected temperature between about 1,800° K. to over 3,000° K., and preferably between about 2,000° K. to 2,700° K. The substrate 48 or 66 is heated by radiation from the heater element and by the chemical reactions occurring at the substrate surface. It is maintained at a selected temperature of less than 1,500° K. and preferably within the range of 700° K. to 1,400° K. by the coolant gas circulating in the channels 49 or 69.

Under these conditions, homogeneous and heterogeneous reactions (i.e. in the gas or at a surface, respectively) occur among the hydrogen, atomic hydrogen, hydrocarbons and surface carbon of the graphite heater element and on the substrate which result in carbon atoms being deposited on the substrate 48 or 66 in the form of a growing diamond film so long as the proper conditions, described in more detail below, are maintained. Although applicant does not want to be limited to a particular physical mechanism and the particular nature of the mechanism is not critical to the functioning of the invention, it is thought that much of the carbon is deposited on the substrate 48 or 66 in the form of non-diamond carbon products which are preferentially attacked by atomic hydrogen and converted to methane or other hydrocarbon gas, thereby leaving a substantially pure diamond film on the substrate.

It has been found that heterogeneous reactions of hydrogen and graphite at the surface of the graphite heater element 33 or 61 can be slow (see High Temperature Vapors, Hastie; Academic Press, 1975) and in some cases thermodynamically unfavorable at low pressure and high temperature, particularly if the surface of the graphite heater element is smooth and non-porous. It is therefore preferred that the surface of the graphite heater element 33 or 61 be rough and porous in order to increase the total available surface area and to increase the duration of contact between hydrogen and carbon atoms.

Figure 3:
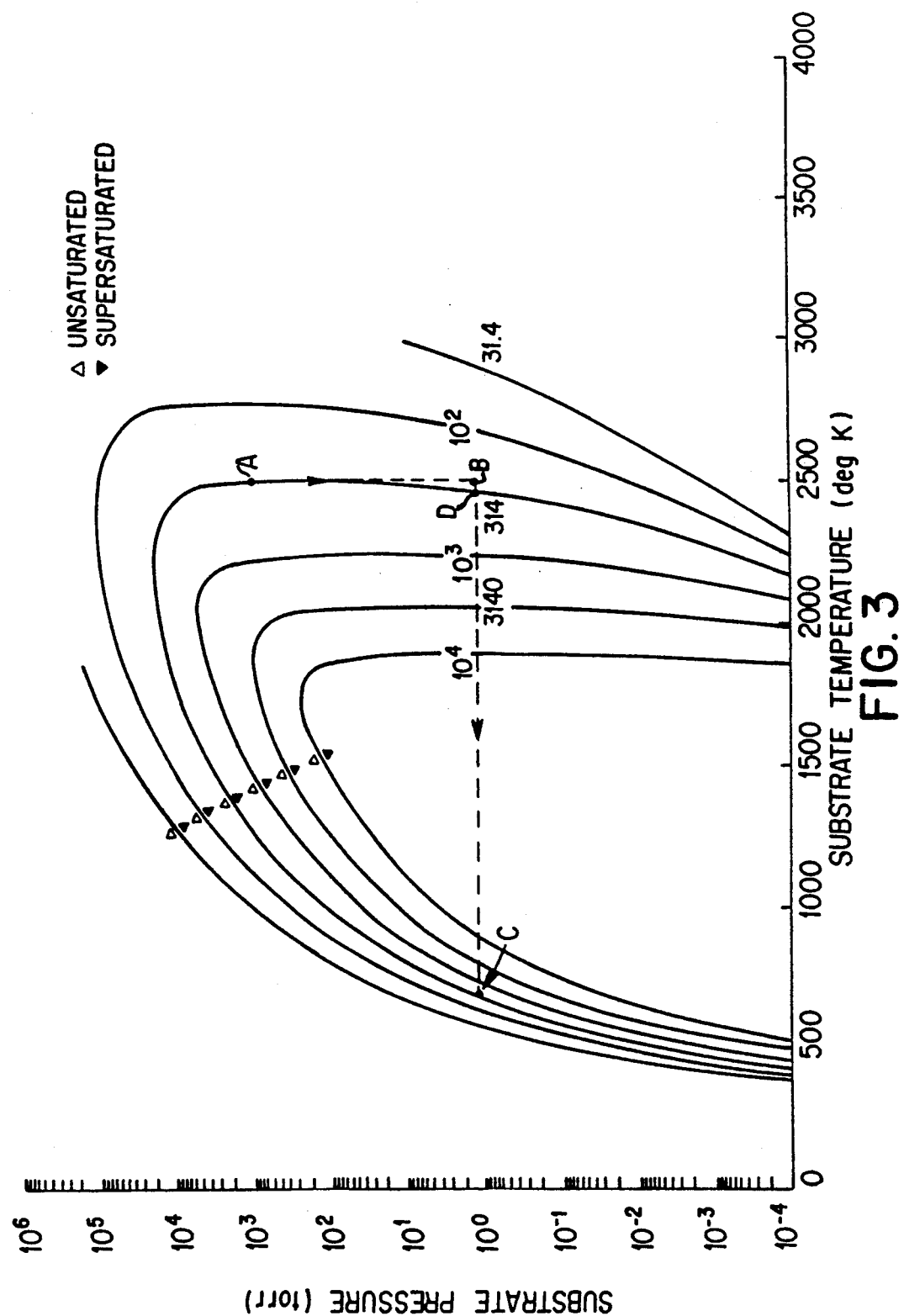
FIG. 3 is a graph depicting carbon saturation curves for a hydrogen-carbon mixture.

Operation of the transfer cells of the invention can be characterized by reference to FIG. 3 which shows carbon saturation curves for different gaseous mixture ratios of hydrogen and carbon, with the carbon being present in the form of hydrocarbon molecules and radicals, and as a minor amount of carbon vapor. A gas near the surface of the graphite heater element 33 or 61 having a mixture ratio of 314 hydrogen atoms per carbon atom, with the heater element operating at a temperature of about 2,420° K. and at a selected pressure value, preferably between about 0.1 and 200 Torr, in the present case at 1 Torr, is illustrated at point D in FIG. 3. It can be seen in FIG. 3 that the gas in this case is in equilibrium. The gas now moves kinetically to the substrate 48 or 66, which is maintained at a selected temperature preferably between 700° and 1,400° K. such that the mixture at the surface of the substrate is slightly supersaturated with carbon. In the present case, the substrate temperature is at 700° K. illustrated as point C on FIG. 18. The gas reacts on the surface of the substrate 48 or 66 and because it is slightly supersaturated with carbon leaves some carbon atoms in a surface layer. This layer grows as a diamond film if the mixture ratio of hydrogen and carbon atoms leaving the hot surface of the heater element 33 or 61 is close to thermo-dynamic equilibrium.

The hydrocarbon gas (primarily methane) formed the surface of the substrate 48 or 66 and the unreacted hydrogen at the substrate surface is transported kinetically back across the gap to the graphite heater element 33 or 61 where the cycle repeats again. The transfer of carbon back and forth between hot and cold surfaces ensures that all of the carbon that is not exhausted from the cell during operation or retained in the heater 33 or 61 element ultimately is introduced into the growing diamond film.

Figure 5:
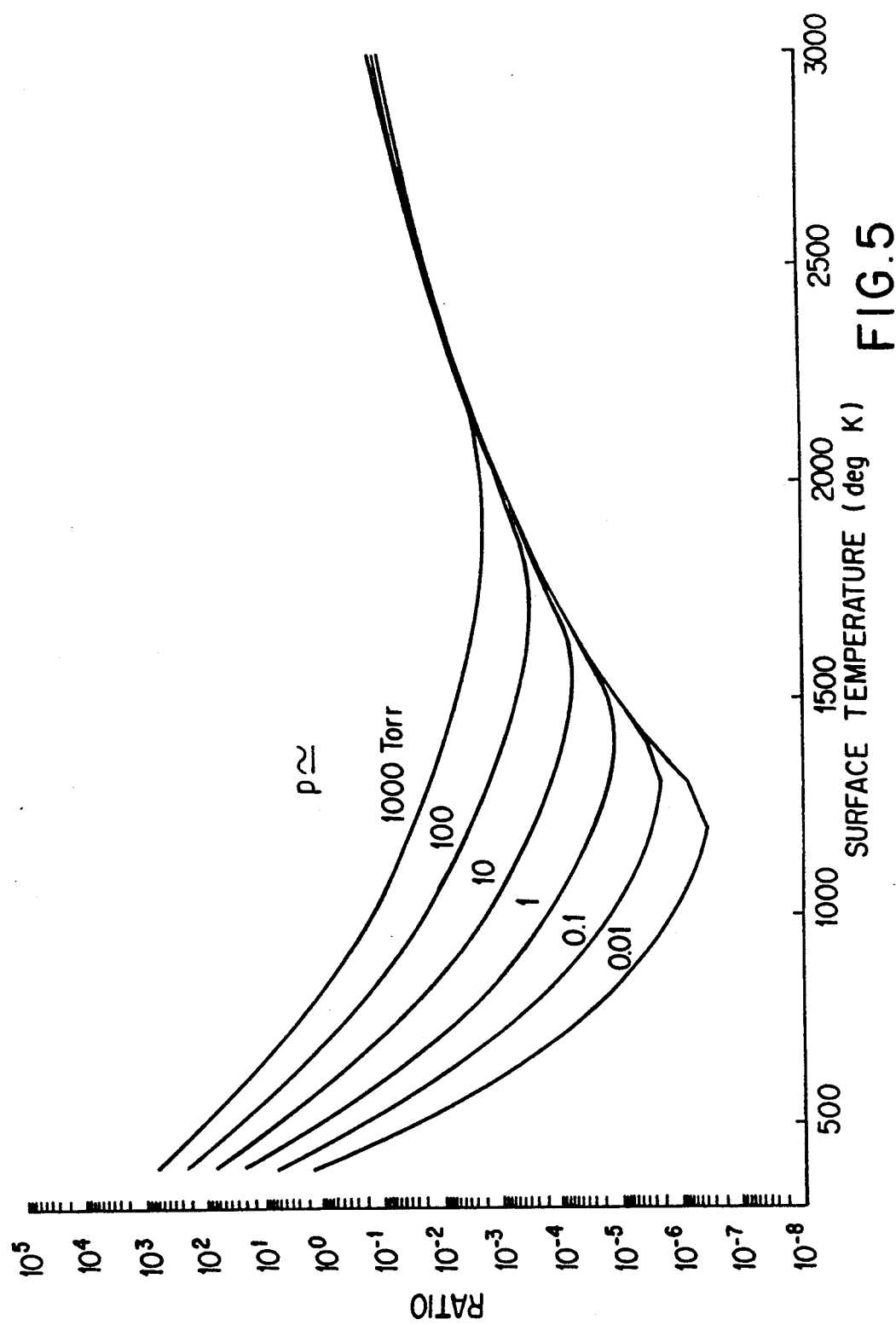
FIG. 5 is a graph of the ratio of hydrocarbon molecules to hydrogen molecules as a function of temperature and pressure in a carbon box containing hydrogen.

The graph of FIG. 5, which shows the equilibrium ratio of hydrocarbon molecules to hydrogen molecules in a carbon box containing hydrogen as a function of temperature and pressure demonstrates that hydrocarbon molecules are formed on the surfaces of both the substrate and the heater element thus carrying carbon back and forth between the two surfaces. Further examination of FIG. 5 indicates that if the hot surface operates at temperatures of between 2,100° and 2,300° K., 1 hydrocarbon molecule per 100 to 300 hydrogen particles is formed on the surface and transferred kinetically to the substrate.

The gap is preferably between about 5 to 50 mils depending on ambient pressure and temperature. A significant advantage of working in th kinetic regime is that the process is insensitive to gap width. An important consideration affecting diamond film growth rates in transfer cells in accordance with the invention is the gap between the hot surface of the graphite heater element or other source of carbon atoms and the substrate, and the gap's relation to the "mean free path" of molecules in the gas in the gap. If the gap width is less than about 10 times the mean free path in the gas, the net flux of carbon in the transfer cell may be computed using thermodynamic and kinetic calculations. Under proper conditions for depositing diamond film, some fraction of the net flux rate can be identified as the growth rate of diamond film. Conditions for this to occur in the kinetic regime are the following:

(1) The ambient pressure in the deposition chamber should be chosen and the gap width set such that the gap is less than about ten times (and preferably less than about five times) the mean free path. Since the gas is largely hydrogen, hydrogen-hydrogen collisions dominate and, the following relation holds true:

$$g = X\lambda$$
$$= \frac{X k T_s\ 1000}{pq}$$

where:
g = gap in millimeters
lamda = mean free path of hydrogen atom or molecule = $Kt_s/p_s q$
where:
k = Boltzman's constant
$t_s$ = temperature of substrate in degrees K
$p_s$ = pressure at the substrate surface in atmospheres
q = collision cross-section for hydrogen particles = $1.5 * 10^{-19}$ m$^2$
X = multiple of mean free path For instance, if the substrate is operated at a surface temperature of 1,300° K., then $$g = \frac{X * 1.38 * 10^{-23} * 1300 * 100\ \text{m.m.}}{\frac{1.013 * 10^5 * 1.5 * 10^{-19}}{760} p(\text{Torr})}$$

$$= \frac{.90 X}{p(\text{Torr})}\ \text{m.m.}$$

It is difficult to control gaps of under about 5 mils (0.005 inches or 0.13 m.m.). With a 5 mil gap and a value of 5 for the chosen multiple of the mean free path, $X_1$ (meaning that on average five collisions would occur as a hydrogen atom moves from one surface to the other), the pressure at the substrate surface for this mode of operation would be P = 0.90 * 5/0.12 = 35 Torr. At pressures of this value or less, one could expect uniform deposition rates over large surface areas.

Figure 4:
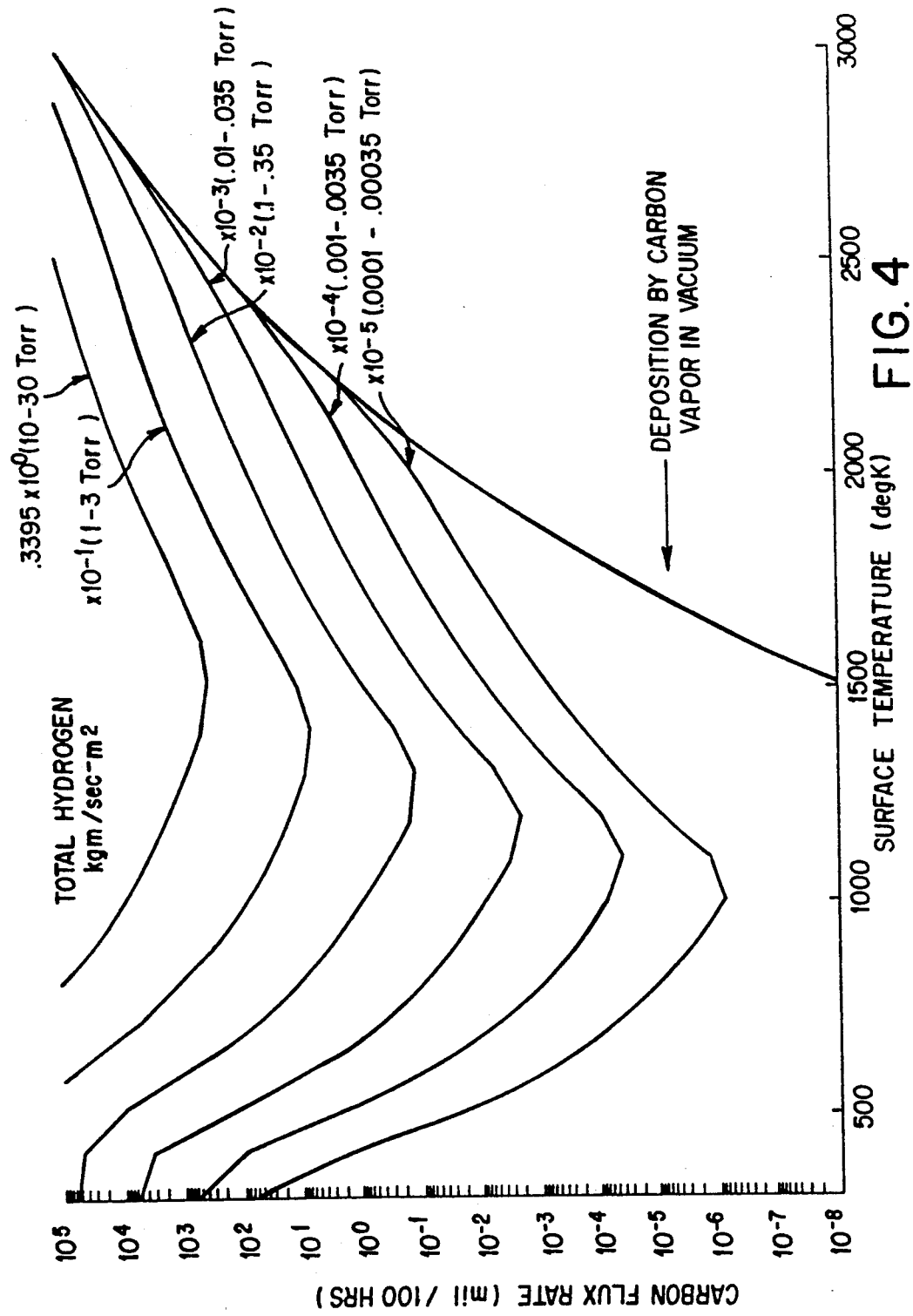
FIG. 4 shows a graph of carbon atom emission or return rate from a carbon surface in a hydrogen atmosphere for different pressures expressed as a deposition rate on a facing surface assuming that all impinging carbon atoms deposit on said facing surface.
Figure 12:
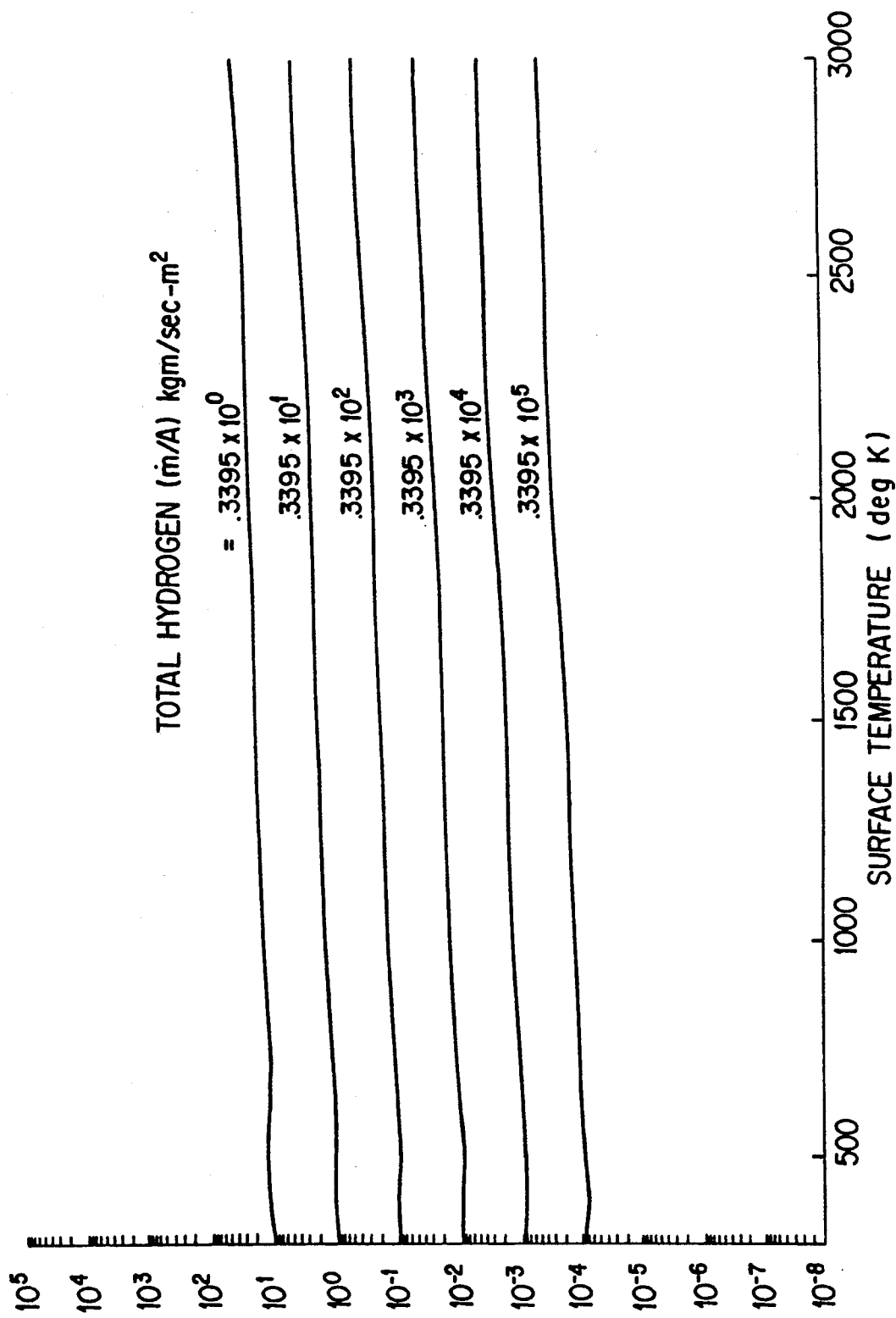
FIG. 12 is a graph of pressure at a surface of a carbon box containing hydrogen as a function of hydrogen mass flux rate and temperature, with no carbon vapor.
Figure 13:
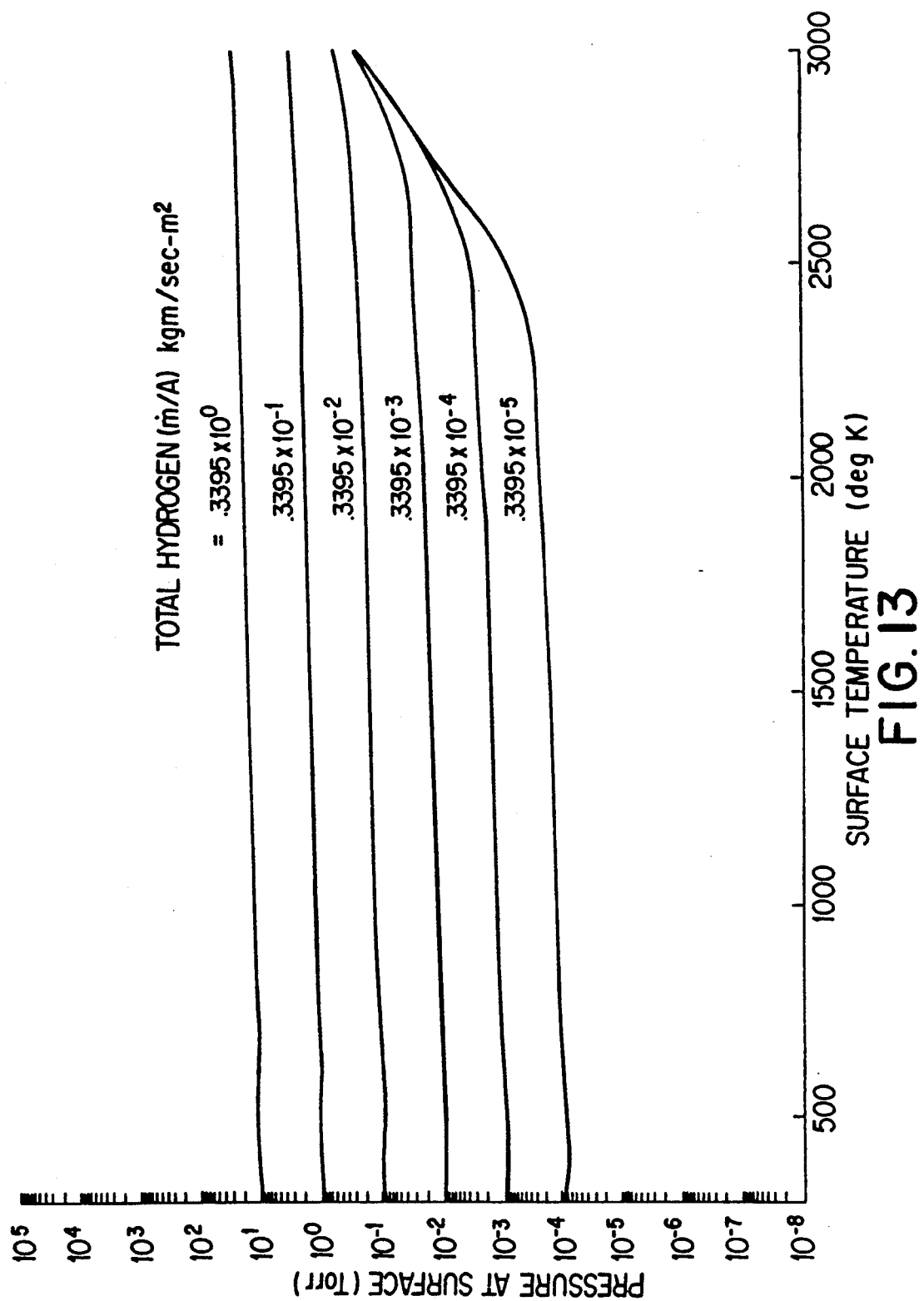
FIG. 13 is a graph of pressure at a surface of a carbon box containing hydrogen as a function of hydrogen mass flux rate and temperature, taking carbon vapor into account.

(2) The rate at which carbon atoms are emitted by or evaporate from a surface in an ambient hydrogen atmosphere is plotted as a function of temperature and pressure in FIG. 4. This graph can be used to determine the required relationships between the temperatures of the graphite heater element and the substrate in transfer cells of the invention for different pressures. It also demonstrates the effect of varying parameters in a transfer cell. If one were to choose a substrate temperature of 1,100° K. and a pressure in the gap of 7 Torr, FIG. 4 indicates that there would be an evaporation rate or return rate of carbon from the substrate to the high temperature heater element of about 1,000 mils/100 hours. It should be noted in FIG. 4 that the traces in the graph are lines of constant hydrogen mass flux rate which is a measure of the numbers of hydrogen atoms impacting a unit area of a surface in one second. As seen in FIGS. 12 and 13, the pressure of the gas is a function of both the mass flux rate and the temperature so that, for instance, the trace in FIG. 4 representing a hydrogen mass flux rate of $0.3395 \times 10^{-1}$ corresponds to a pressure varying between 1 Torr at 300° K. to 3 Torr at 3,000° K.

(3) Although there are various theories on the exact mechanisms involved, it is generally agreed that in order to insure good diamond film deposition it is necessary to evaporate or return a high percentage of the carbon atoms which impinge the substrate surface. In other words, the net flow of carbon atoms in the gap between the facing surfaces of the substrate and the carbon heater element should be only slightly biased in the direction towards the substrate. If the return rate of carbon from the substrate towards the heater element is 1,000 mils/100 hours, the rate of evaporation or return of carbon atoms from the hot surface of the carbon heater element towards the substrate should be just slightly higher than that rate. Referring again to FIG. 4, if the substrate temperature is 1,100° C. and the pressure 7 Torr, this would require a temperature of about 1,800° K. at the surface of the carbon heater element.

(4) If we assume that the rate of deposition of diamond of the character desired on the substrate is 1/10 of the impingement rate of carbon on the substrate, then the temperatures of the substrate and the surface of the carbon heater element should be such that the rate of emission or return of carbon atoms from the substrate is 90% of that from the heater element. Thus, if the return rate from the substrate is 900 mils/100 hours then the net deposition of diamond on the substrate is 100 mils/100 hours or 25 microns/hour.

(5) If the pressure were dropped, for examples, to 0.1 Torr, comparable rates of diamond film growth would occur only if the temperatures of both the substrate and the high temperature heater element were changed. Referring to FIG. 4, to maintain the same rate of diamond film growth, the temperature would have to be adjusted as follows:

Required substrate temperature = 560° K. = 283° C.
Required source temperature = 2500° K. = 2223° C.

This indicates that the substrate temperature must be lowered and the temperature of the heat source must be raised in order to maintain the deposition rate of diamond film at lower ambient pressures.

Control of all three parameters, i.e., the ambient pressure, the substrate temperature, and the heat source (graphite) temperature is required to ensure a given quality and deposition rate of diamond films. Referring to FIG. 4, the following trends occur with deviations from a given set of design values:

(1) Pressure drops below design value

Since, as can be seen by the variation of the separation of the traces, the rate at which carbon return from the substrate at its relatively low operating temperature drops more than that at the hotter carbon heater element surface for a given drop in pressure in the gap, the impingement rate of carbon on the substrate relative to the return rate would increase rapidly. If the drop were substantial, this would result in deposition of graphite or some other non-diamond carbon. The growth rate of this film would be lower than the design diamond growth rate.

(2) Pressure rises above the design value

The impingement rate of carbon on the substrate would tend to drop below the return rate of carbon from the substrate toward the carbon heater element. This would result in rapid decrease in the diamond film growth rate and, if the pressure rise were substantial, would result in the etching away of previously deposited diamond film from the substrate.

(3) The substrate temperature increases beyond the design value

The return rate of carbon from the substrate now decreases relative to the impingement rate from the carbon heater element rate and graphite or non-carbon films tend to grow.

(4) The substrate temperature falls below the design value

The return rate of carbon from the substrate increases beyond the impingement rate so that the deposition rate of diamond on the substrate rapidly decreases and etching of the diamond film eventually occurs.

(5) The temperature of the carbon heater element rises above the design value

The impingement rate of carbon on the substrate increases relative to the return rate from the substrate and non-diamond films tend to be deposited.

(6) The temperature of the heat source falls below the design value

The return rate of carbon from the substrate increases relative to the impingement rate on the substrate, resulting in a reduction in deposition rate of the diamond film and if substantial, leading to etching of the film.

In addition to the nature of the growth/etch process changing with the three prime control parameters, the quality of the film also changes as any one of these three quantities move away from the design value. The sequence of change is shown in the following growth diagram.

DIAGRAM A

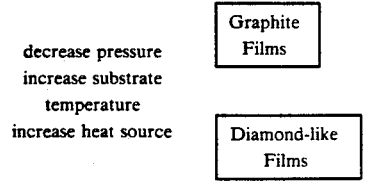

decrease pressure
increase substrate temperature
increase heat source

-continued
DIAGRAM A

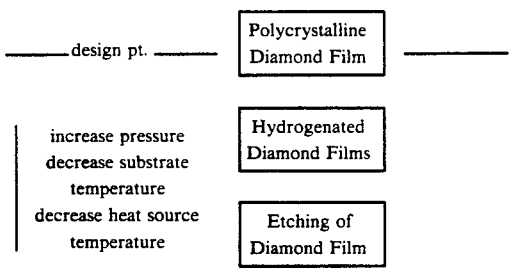

In the diagram displayed above, several types of films are listed:

Diamond-like films are a hard form of carbon which is not quite diamond but which is much harder than graphite. It is the easiest useful diamond-like film to make and may be used as in abrasive and in other applications such as coatings for bearings. It has a high thermal conductivity of approximately half that of pure diamond. It is normally black in color.

Hydrogenated diamond film contains hydrogen atoms in significant amounts. Such a film is translucent, hard and has a relatively high thermal conductivity. By analogy with hydrogenated amorphous silicon, by proper doping, hydrogenated diamond film may be utilized to make semiconductors. A further use for hydrogenated diamond film would be in the manufacture of windows.

Polycrystalline diamond films are films which consist of closely packed diamond crystallites usually approximately 10 to 50 microns in size, although different crystal sizes are possible. They are layered as the thickness of the film increases. They may be used in many applications, for example, bearing surfaces, grinding powder and thermal controls.

Epitaxially grown diamond films can result if a diamond or diamond-like crystalline substrate is used. In such case, an epitaxial diamond film can be grown by depositing carbon particles on the surfaces thereof. By proper doping, these grown layers may be utilized as semi-conductors. Such films have high thermal conductivity.

When deposition of diamond films is referred to herein and in the claims it is intended to include either polycrystalline or epitaxial diamond, hydrogenated diamond or diamond like carbon. It is a significant advantage of the diamond deposition cell of the present invention that it is suitable for depositing any of these types of film by simple adjustment of operating temperatures, pressures and gas mixtures.

Figure 6:
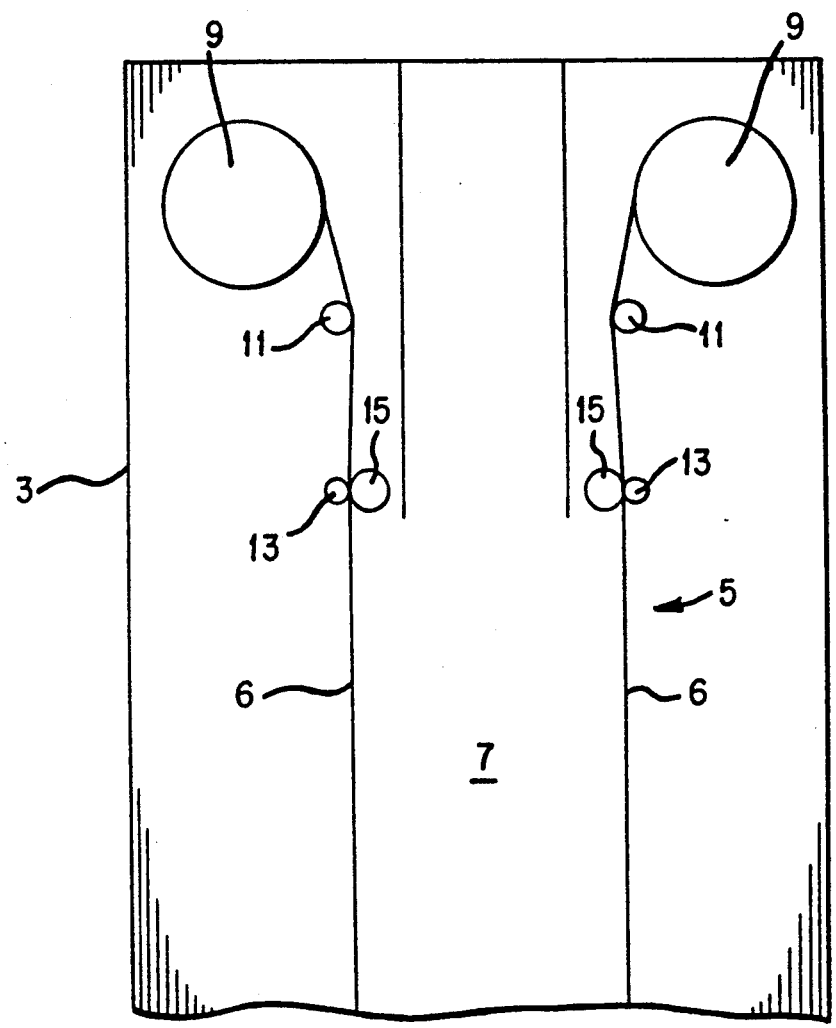
FIG. 6 shows an embodiment of substrate feed roller in a transfer cell deposition facility.
Figure 7:
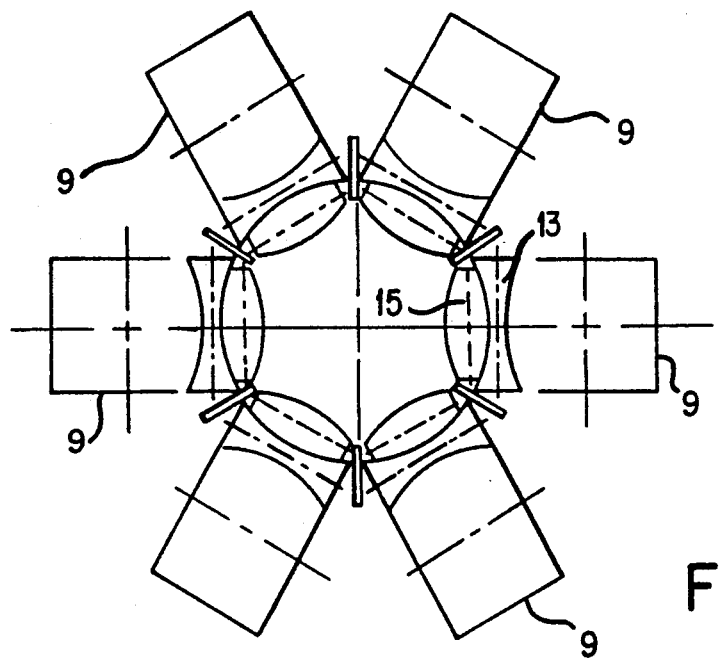
FIG. 7 shows further details of the substrate feed roller system.
Figure 8:
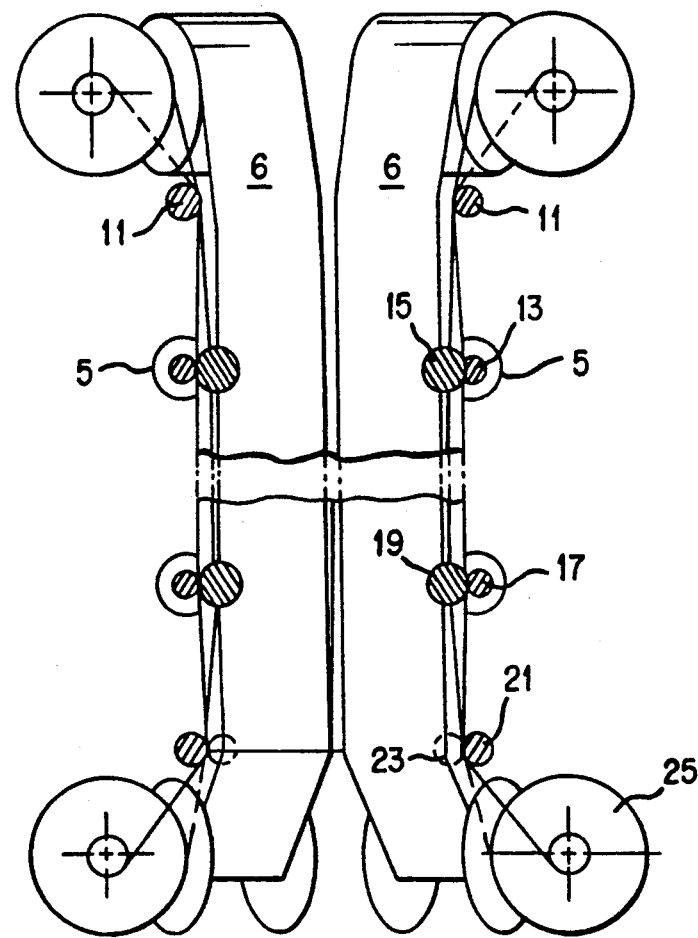
FIG. 8 is a cross-sectional view along the line 5—5 of FIG. 4

Reference is now made to FIGS. 6, 7 and 8 wherein a substrate feeding system is shown which is useful in connection with the present invention.

FIG. 6 shows a deposition chamber 3 in which diamond film is to be formed. A substrate system generally designated by the reference numeral 5 is centrally conveyed within the chamber 3 and defines in its midst a subchamber 7 where deposition is to take place.

As seen in FIGS. 6, 7 and 8, a plurality of feed rollers 9 are mounted in circumferentially spaced relation. As best seen in FIGS. 7 and 8, shaping rollers 13, 15 have respective concave and convex complimentary surfaces designed to shape the individual substrates 6 in such a manner that a plurality of circumferentially related substrate strips 6 combine together to form a cylindrical substrate best seen in FIG. 5. Shaping rollers 17, 19 are similar in construction to the rollers 13 and 15, respectively, and are provided to maintain the cylindrical shape of the combination substrate formed by the plurality of substrate strips 6. Drive rollers 21, 23 frictionally engage the substrate strips 6 to pull them along through the deposition chamber and take-up drums 25 are provided to store them in roll form. The illustrated substrate feeding system is suitable for use when carbon atoms are propelled toward the substrate in circumferentially spaced radially outward directions. In situations where the carbon atoms are propelled in a linear path substantially parallel to one another, a supply system for the substrate which maintains it in a flat configuration is preferred. If the diamond is deposited as a continuous film, it would have to be separated from the substrate 6 before the substrate 6 is wound on the take-up drums 25.

The temperature of the substrate must be maintained at a selected temperature within the range of less than 1,500° K. and preferably of 700°–1,400° K. in order to optimize deposition parameters.

When thin substrates or substrates having adequate thermal conductivity are used, their temperature may be controlled by keeping them in intimate thermal contact with a substrate holder which is maintained at or somewhat below the desired temperature. Most or all of the heat used to maintain the desired substrate temperature is received by the substrate either as radiation from the hot surface of the heater element or as chemical reaction energy, e.g., impacting hydrogen atoms combining to form molecules. This heat is then conducted or radiated to the substrate holder through the substrate.

The substrate holder temperature may be stabilized at a desired temperature by using a combination of a constant temperature heat sink and a control circuit for controlling energy input or cooling to the substrate holder. In this regard, a thermocouple or other temperature sensing device may be attached to the substrate holder to sense the temperature thereof and, responsive thereto, to selectively activate cooling means such as a cooling gas flowing through conduits in heat exchange relation to the substrate holder. The range of temperature for the substrate holder, as stated above, is typically in the range of 700° K. to 1,400° K., a particular transfer cell in accordance with the invention is normally set up to operate at a particular selected temperature for example, at 1,300° K. Once an optimum is established experimentally, that temperature is preferably maintained within a tolerance of about +/− 10° C. or better. Table A lists materials which have a phase change, solid to liquid, within this temperature range.

TABLE A

| Material | Melting Point °K | Heat of Fusion Cal/gm | Vapor Pressure at Melting Point p Torr |
|---|---|---|---|
| Ge | 1232 | 114 | $1*10^{-7}$ |
| Fe$_3$C | 1500 | 68.6 | |
| LiF | 1169 | 91.1 | .072 |
| Nd | 1293 | 11.8 | |
| KF | 1148 | 111.9 | 1.22 |
| Ag | 1234 | 25.0 | $3*10^{-3}$ |
| Cu | 1356 | 49.0 | $3*10^{-4}$ |
| NaCl | 1072 | 123.5 | .45 |
| NaF | 1265 | 166.7 | .32 |
| SnO | 1315 | 46.8 | |

The Table shows the melting point, latent heat of fusion, and vapor pressure of these substances. The latent heat of fusion together with the mass of material permits the calculation of the amount of heat which may be stored at constant temperature in the heat sink. It is well known that when a substance approaches its melting point, further input of energy results in little or no temperature change until it absorbs the heat of fusion, thus, if a substance incorporated into the substrate holder which has a melting point at or close to the desired temperature to be maintained for the substrate, once that substance reaches its melting point, further moderate input of energy causes very little temperature change until actual melting begins, thereby maintaining a steady temperature for the substrate. A control circuit is incorporated into the system so that, as the heat sink material approaches the melting condition or the temperature begins to drop from the melting point it can be cooled or heated, respectively, to maintain the temperature of the substrate.

The heat sink material incorporated in the substrate for temperature control must be sealed in a container so that none of it escapes, especially as a vapor. Table A shows the vapor pressure of some materials with suitable characteristics with the lower vapor pressures being preferred. From Table A it is seen that a use of silver and copper or a combination thereof would yield good results.

In order for the substrate holder to work effectively as described above, the substrate must be kept in intimate contact therewith to ensure that its temperature is accurately controlled, especially with the high radiation and chemical heating sources to which it is subjected.

Several methods of ensuring such intimate contact are considered to form a part of the present invention as follows:

(1) For substantially planar substrates, the substrate holder may be made with a slight convex curvature with the substrate being stretched thereover;

(2) A source of vacuum may be connected to the space between the substrate and the substrate holder to cause the ambient pressure within the chamber to hold the substrate into engagement with the substrate holder;

(3) A thin liquid metal layer may be provided between the substrate and the substrate holder so that surface tension and viscous forces ensure thermal contact. The liquid metal must wet both the surface of the substrate holder and the substrate. Furthermore, the vapor pressure of the liquid metal material must be as low as possible to prevent contamination of the deposited layer. With reference, again, to Table A, germanium appears to be a good candidate for this application;

(4) If a gap of less than 0.005 inches exists over regions of the surface between the substrate and the substrate holder, then, depending on system parameters, the ambient hydrogen gas may be sufficient to conduct adequate heat flux between them so as to maintain the necessary temperature tolerance.

An alternative method of providing the carbon mass in the transfer cell deposition chamber is to feed solid graphite, e.g., in sheet or cylinder configuration over the surface of the heater element facing the substrate. In such case the heater element may be made of a material other than graphite, if desired.

Referring again to FIGS. 1 and 2, the set up and operation of the transfer cells 30 and 60 may be performed as follows:

(1) With the vacuum chamber 31 sealed and with the substrate in place, the chamber 31 is evacuated to a pressure below 1 micron ($10^{-3}$ Torr).

(2) The graphite heater element is heated to a temperature of above 600° K. in order to outgas all adsorbed materials which might have formed on deposition chamber components, especially the substrate.

(3) The vacuum pumps used to evacuate the chamber are connected to the chamber via valve means. The valve means are then closed while heating of the chamber continues and hydrogen gas is introduced into the vacuum chamber until the pressure is elevated preferably to between 100 to 1,000 microns ($10^{-1}$ to 1 Torr). This pressure is held for approximately 4 to 6 minutes, then the chamber is evacuated again to approximately 1 micron pressure.

(4) At that pressure, the valve means are again closed and a working fluid consisting of hydrogen, or a mixture of hydrogen and a hydrocarbon gas such as, for example, methane ($CH_4$), is introduced into the vacuum chamber to the desired pressure level, preferably in the range of 0.1 to 10 Torr. Lower and higher ambient pressures in the range of about $10^{-10}$ to 1,400 Torr may also be used for the gas in the chamber.

(5) The electrical current supplying the heating elements is adjusted to obtain a selected heating element temperature, preferably in the range of 1,800° K. to 2,700° K.

(6) The cooling fluid is caused to flow through the substrate under control of the controller 55 (FIG. 1) to maintain the substrate holder 47 at a selected temperature in the range between 700 to 1,400° K. determined with reference to FIG. 4.

(7) The vacuum pump valve means are adjusted and the injecting rate of working fluid is controlled to maintain the ambient pressure within the vacuum chamber 31 at a selected pressure within the range of 0.1 to over 200 Torr determined with reference to FIGS. 3 and 4.

(8) These parameters are maintained constant for sufficient time for the desired thickness of diamond film to be deposited on the substrate.

(9) Once a film has been deposited, flow of working fluid is stopped and the vacuum pump valve means are opened to evacuate the chamber.

(10) The temperature of the substrate may be adjusted to allow the deposited film to be thermally processed to the desired degree.

(11) Thereafter, the current applied to the heater element is slowly reduced to zero to allow the temperature within the chamber to drop below 400° K. before the chamber is opened. The heater element may alternatively be heated through the use of other energy sources, such as, for example, combustion gasses. In such event, as is described in greater detail below, the combustion gas supply to the heater element is controlled in a corresponding manner as is admission of cooling gas to the substrate holder to control the temperature of the heating element.

Figure 9:
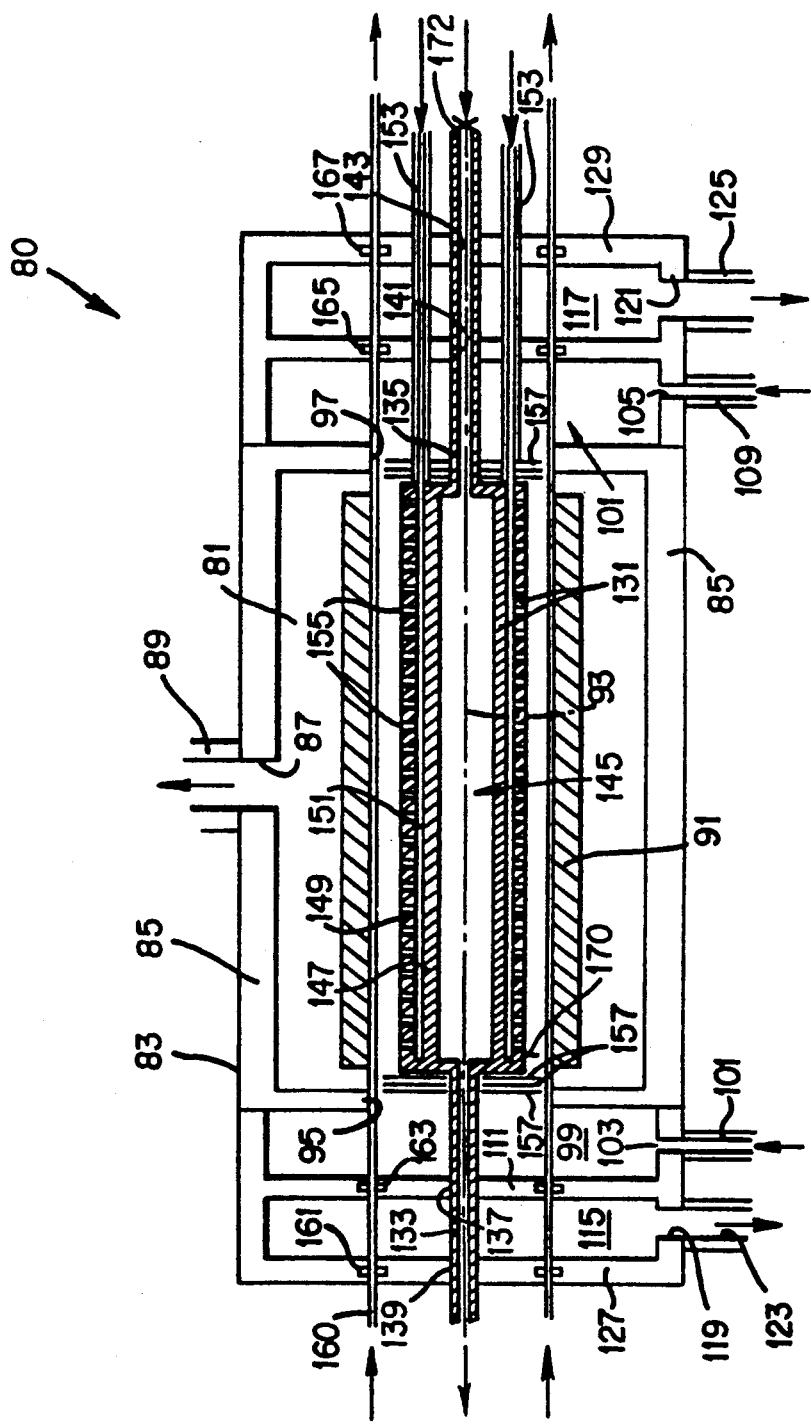
FIG. 9 is a cross-sectional view through another embodiment of diamond deposition cell.
Figure 10:
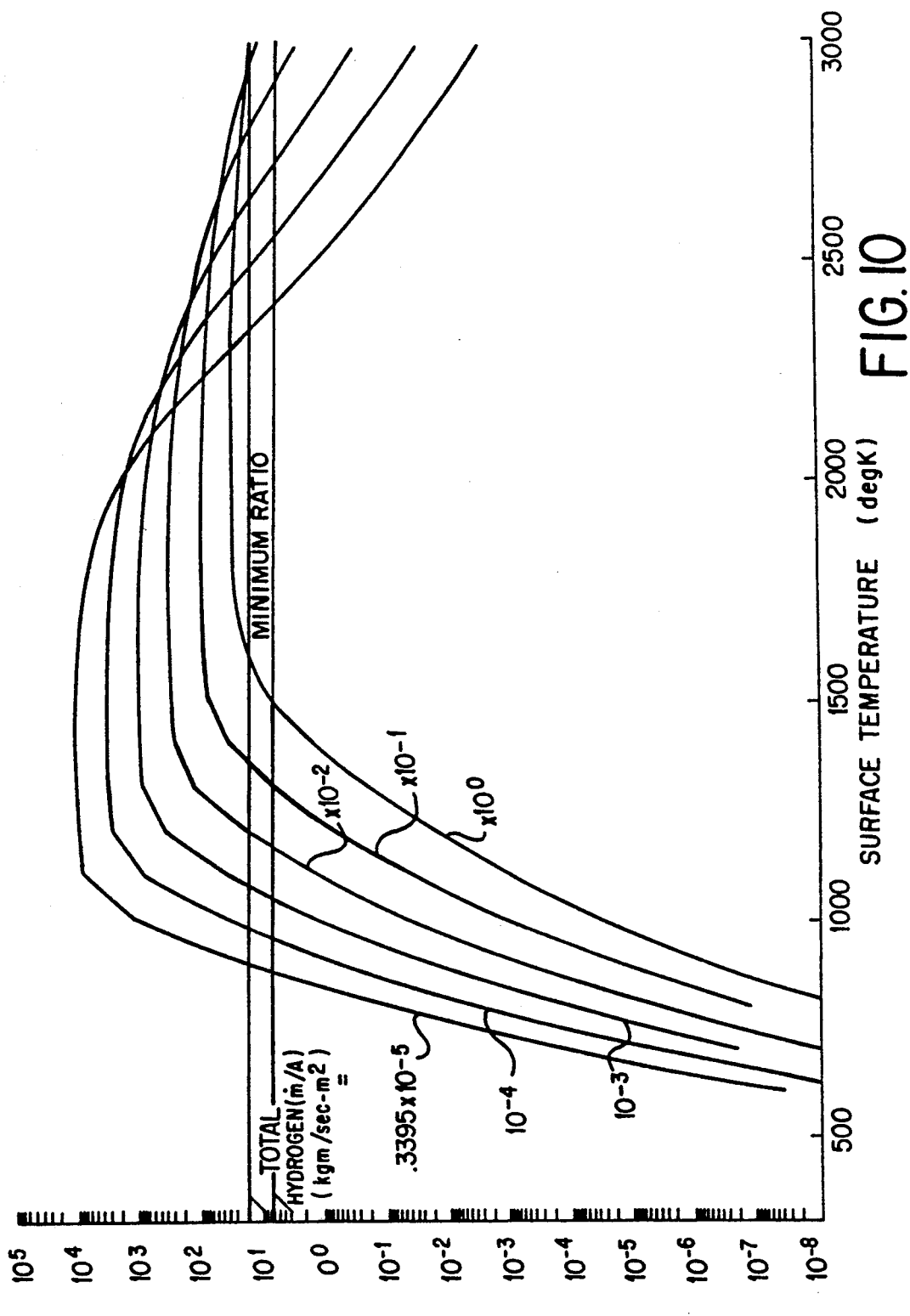
FIG. 10 is a graph of the ratio of hydrogen atoms in the form of atomic hydrogen to total carbon atoms impinging on a surface of a carbon box containing hydrogen as a function of ambient pressure and surface temperature.
Figure 11:
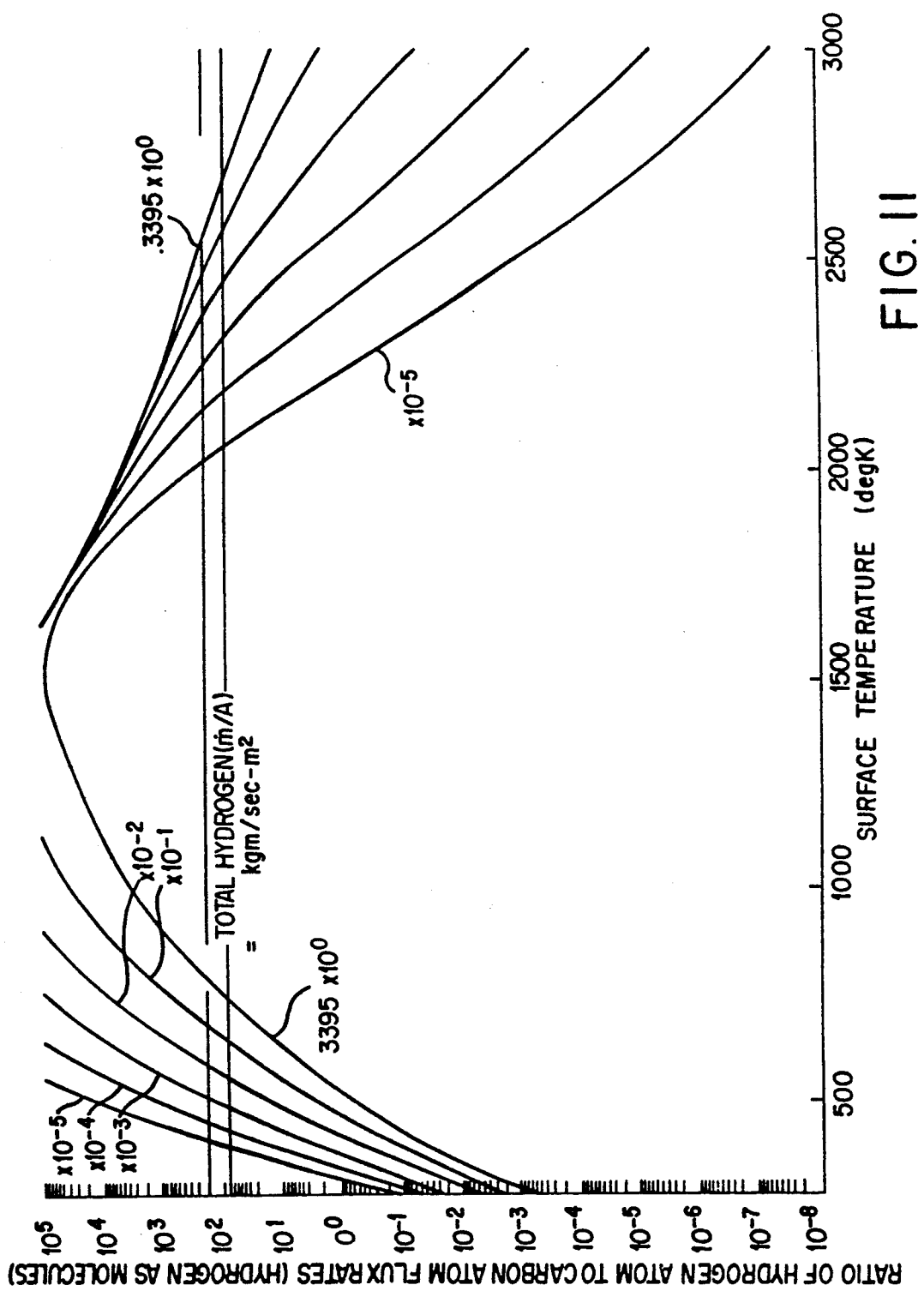
FIG. 11 is a graph of the ratio of hydrogen atoms in molecular form to total carbon atoms impinging on a surface of a carbon box containing hydrogen as a function of pressure and temperature.

Referring now to FIG. 9, a further embodiment of the present invention is illustrated in which a transfer cell 80 includes a vacuum chamber 81 contained within an outer shell 83. A port 87 in the graphite reactor component 85 and shell 83 connects with a conduit 89 leading to a source of vacuum such as, a vacuum pump (not shown).

A substrate holder 91, which may be substantially cylindrical, having a longitudinal axis 93 is centrally mounted within the vacuum chamber 81. Openings 95 and 97 are formed in the shell 83 in alignment with the axis 93 to allow for feed troughs and other structure.

The openings 95 and 97 connect subchambers 99 and 101 with the vacuum chamber 81. The subchambers 99 and 101 have respective ports 103 and 105 which communicate via respective conduits 107 and 109 with sources of hydrogen gas.

The subchambers 99 and 101 are defined by respective outer walls 111 and 113 which also comprise respective inner walls of respective sealing chambers 115 and 117 each of which is connected to a source of vacuum such as a vacuum pump (not shown) via respective ports 119 and 121, and respective conduits 123 and 125. The outer extent of each sealing chamber 115, 117 is defined by respective outer walls 127 and 129.

A graphite firebox 131 is centrally mounted within the vacuum chamber 81 by hollow cylindrical support conduits 133, 135. The conduit 133 extends through openings 137 in wall 111 and 139 in wall 127, while the conduit 135 extend through Openings 141 in wall 113 and 143 in wall 129.

The firebox 131 includes a central chamber 145 defined by inner surrounding wall 147. Outer wall 149 of the firebox 131 is slightly spaced outwardly from the inner wall 147 to define therebetween an annular chamber 151 which is connected via conduits 153 with a source of hydrocarbon gas.

The conduit 135, which preferably includes a pair of separate flow channels, is connected to sources of reactant gasses and terminates in a suitable injector (not shown) for mixing and efficient burning of the gasses in the firebox 145. The flow of reactant gasses to the combustion chamber 145 is controlled by the dual valve 172. A spark plug or other ignition device (not shown) may be needed to initiate combustion in the firebox 145. Conduit 133 is provided to exhaust combustion gas products from the chamber 145.

Radiation shielding means 157 in the form of a plurality of parallel discs are provided at each end of the firebox 131 to retard the outward radiation of heat from the firebox to facilitate control of the temperature thereof.

A substrate 160 is fed through the vacuum chamber 81 via seals 161, 163 and is conveyed from the vacuum chamber 81 via seals 165, 167. The means for supplying and removing the substrate 160 with respect to the vacuum chamber 81 may be as described above with reference to FIGS. 6, 7 and 8. In other words, the substrate 160 may comprise a plurality of sections which are circumferentially combined to form an essentially cylindrical substrate.

The outer wall 149 is shown schematically as having a plurality of flow passages 155 therethrough. Such passages may be fine holes (on the order of 1 to 20 mils in diameter) extending from the inner to the outer surface of the outer wall 149. Preferably, however, such passages are formed by pores in the outer wall 149 which, in the illustrated embodiment, is made of porous graphite, such as Poco Graphite's AXZ-SQ, to allow hydrocarbon gas fed into the chamber 151 and heated by burning reactant gasses in the combustion chamber 151 to pass therethrough and enter into the deposition chamber at the gap between the outer surface of the outer wall 149 and the substrate 160 on which diamond is to be deposited. The porosity and thickness of the graphite is selected to provide the proper pressure drop thereacross and flow rate therethrough to provide the desired ambient pressure in the gap. Typical porosities are in the range of 10% and 20% but can go as high as 40%. Typical thickness of the wall 147 is from about 0.2 to 0.8 inches.

The hydrocarbon gas introduced into the chamber 15 through the conduit 153 may be introduced at "high" pressure, e.g. about 1 to 10 atmosphere. Oxygen may be mixed with the hydrocarbon gas to alleviate the possible plating out of carbon as will be discussed in more detail below. If desired, the introduced gas may be hydrogen or a mixture of hydrogen and hydrocarbon gas, with the hydrogen supplementing or replacing the hydrogen supplied at the ports 103 and 105. These gasses diffuse through the porous outer wall 147. As the gasses diffuse they react with the carbon and each other and due to the transit time (typically 1 milli-second or more), the mixture comes to equilibrium. The gas thus leaves the hot surface in the desired thermodynamic state as it moves to the substrate, where some of the carbon is deposited as diamond.

Because the flow rate is low when the pressure is low, the impurities in the gas in the gap should be maintained at a low level, preferably better than one part in one hundred thousand.

Although not preferred, other materials, such as porous tungsten can also be used for the outer wall 147 rather than porous graphite. The metal serves to catalyze the reactions as the gasses diffuse through the thick walls but can cause frequently serious problems with contamination of the system.

The combustion gasses may be, for example, a hydrocarbon burned with air or oxygen enriched air with the combination burned at a sufficiently high temperature to heat the firebox 131 to a selected temperature of between 1,800° and 2,500° K. or higher. The fuel may be any materials which react together to release heat at combustion temperatures of over 2,000° K. such as, for example, hydrogen and oxygen. For example, methane and air would burn at a temperature of approximately 2,232° K. while hydrogen and oxygen would burn at a temperature of approximately 3,077° K. If natural gas or the equivalent were to be used, it may be necessary to enrich the oxidizer (air) with additional oxygen.

Because of the high temperature which is required for the heat source of the transfer cell the combustor may be similar to a rocket engine combustor. Table B displays some suitable combinations of fuel and oxidizer together with their combustion temperatures.

TABLE B

| Fuel | REACTANTS | |
|------|-----------|---|
|      | Oxidant   | Temperature °K |
| Kerosene | Air | 2440 |
| Hydrogen | Oxygen | 3077 |
| Methane | Air | 2232 |
| Methane | Oxygen | |
| CO | N₂O | 2800 |
| Acetylene | Oxygen | |

A temperature sensor 170 is attached to the firebox 131 for use in controlling the temperature of the outer surface of the outer wall 147 by opening and closing of the dual valve 172 which controls the supply of reactants into the inlet conduits 135.

If desired, and as will be described in more detail in relation to the embodiment of FIG. 15, a phase change heat sink component such as that which was described hereinabove for use with the substrate holder may be incorporated to assist in maintenance of the desired temperature of the surface of the wall 149. Materials which are candidates for use in this regard are listed in Table C.

TABLE C

| Element | Melting Point °K | Dh cal/gm | PTorr | R |
|---------|------------------|-----------|-------|---|
| Boron | 2573 | 490 | .39 | |
| Chromium | 2130 | 62.1 | 7 | |
| Hafunium | 2500 | 34.1 | $10^{-3}$ | |
| Iron | 1808 | 63.7 | $10^{-2}$ | |
| Platinum | 2045 | 24.1 | $2*10^{-4}$ | |
| Technetium | 2445 | — | | |
| Thorium | 2023 | 19.8 | $10^{-5}$ | |
| Titanium | 1933 | 104.4 | $5*10^{-3}$ | |
| Vanadium | 2163 | — | $10^{-2}$ | |
| Zirconium | 2125 | 60 | $10^{-8}$ | |
| $Al_2O_3$ | 2318 | 256 | — | |
| BaO | 2196 | 93.2 | — | |
| BcO | 2823 | 679.7 | .016 | |
| $Ta_2O_5$ | 2150 | 108.6 | | |
| $Y_2O_3$ | 2500 | 110.7 | | |

Operation of the transfer cell of FIG. 9 can be characterized by reference to FIG. 3 in a manner similar to the embodiment of FIGS. 1 and 2. If a gas having, for example, a mixture ratio of 314 hydrogen atom is introduced into the second chamber 151 at a pressure of about 1,000 Torr with the firebox 131 operating at a temperature of about 2,450° K., the starting point for the gas is at point A in FIG. 3. As the gas diffuses through the porous outer wall 149, the pressure drops until it reaches a selected value between 0.1 and 100 Torr in the deposition chamber, in the present case at 1 Torr as illustrated at point B in FIG. 3, which, in this case, is slightly unsaturated. The gas now moves kinetically to the substrate 160, which is maintained at a selected temperature between 700 and 1,400° K. such that the mixture at the surface of the substrate is supersaturated with carbon. In the present case, the substrate temperature is at 700° K. illustrated as point C on FIG. 3, representing only slight supersaturation. The gas reacts on the substrate surface to leave some carbon atoms in a surface layer. This layer grows as a diamond film if the mixture ratio of hydrogen atoms, molecules, hydrocarbon and carbon atoms leaving the hot surface is close to thermodynamic equilibrium.

A graphite reactor component 85 is mounted on the inner surface of the walls of the deposition chamber 81 and is heated by heat which has been radiated or otherwise carried out of the deposition area to a temperature of between about 700° K. and 900° K. The surface of the graphite reactor is porous so that hydrogen atoms and molecules within the chamber may enter and combine with carbon in the graphite reactor to form hydrocarbon gasses which may easily be removed from the deposition chamber by a vacuum system at much less expense than that which would be needed to remove hydrogen atoms and molecules per se, due to the higher molecular weights of the compounds formed.

Hydrocarbon gas being supplied to the fire box 131 through the conduits 153 tends to decompose into its constitute parts of hydrogen gas and solid carbon as the temperature of the surface in contact with the gas increases from room temperature to a temperature of between less than about 1,200° K. and about 2,000° K. depending on pressure. This carbon from the gas tends to plate out on interior surfaces of the hydrocarbon supply conduits 153. As can be seen in FIGS. 5 and 5a, the minimum equilibrium ratio of hydrocarbon molecules to free hydrogen increases with the pressure of the gas. Thus, this undesired carbon deposition may be reduced or eliminated by mixing the hydrocarbon gas with sufficient hydrogen and injecting it into the transfer cell in a manner such that it is maintained at high pressure until its temperature has passed that corresponding to the minimum equilibrium ratio for gas at that pressure.

The hydrocarbon gas may also be mixed oxygen, which decreases the tendency of carbon to plate out. Such a mixture may ignite in the chamber which provides further heat to the surface 149. As described below with relation to FIG. 14, the products of such combustion can be used for diamond deposition.

Optimum design of the feed system for the gas may be made with reference to FIG. 5a wherein the equilibrium ratio of the total flow of all hydrogen particles (in atomic, molecular and hydrocarbon form) to all carbon particles (carbon vapor and hydrocarbons) is shown as a function of temperature and pressure. The trends of the curves FIG. 5a indicate that at 10 atmospheres pressure (7,600 Torr), the peak equilibrium ratio of hydrogen to carbon atoms occurs at about 2,200° K. where the ratio is between about 1,000 and 800. Thus, FIG. 5a indicates that, to avoid the problem of carbon plating out on the conduits 153, a maximum of about 0.25% methane should be introduced with hydrogen into the chamber 151 if the pressure is at about 10 atmospheres. At lower pressures the maximum percentage of methane would be reduced.

The thickness and porosity of the graphite wall 149 needs to be selected such that the pressure drop across the wall 149 is sufficient to reduce the gas pressure to the selected pressure in the range 0.1 to over 200 Torr in the gap at which the diamond deposition takes place. The thermodynamic data displayed in FIG. 5a indicates that, in the temperature range 2,000° to 2,300° K., the ratio of hydrogen to carbon atoms is almost independent of pressure. Thus, if the throttling to reduce the pressure to the deposition range is carried out in this temperature range, operating tolerances for avoiding unwanted carbon deposition are not critical. The pressure drop can also be accomplished through the use of a vortex-type fluid resister made of graphite.

The embodiment of FIG. 9 may be optimized to achieve various application objectives:

(1) The transfer cell may be operated in a steady-state 24 hour per day mode using methane as the carbon source and pumping with mechanical vacuum pumps to maintain the correct ambient pressure of hydrogen (0.1-100+ Torr). Using cylindrical or sheet foil as a substrate material in the manner illustrated in FIGS. 6-8, the substrate may be fed continuously through the chamber 81 with the throughput rate of the foil being set to obtain the desired film thickness as the foil travels through and exits the cell. The seals 161, 163, 165 and 167, combined with the vacuum means evacuating the chambers 115 and 117 combine to assist in maintaining the vacuum in the chamber 81 at the desired level.

(2) The pressure in the cell may be optimized for a given application making the following trade-offs: as can be seen by reference to FIG. 4, higher pressure results in higher deposition rates and lower volume pumping rates but requires higher temperature at the graphite wall 149 to maintain the required relationship of carbon atom emission rates from the substrate and the wall which requires more power. Furthermore, as the parameters are changed, different types of diamond or carbon films such as those discussed above may be formed unless all parameters are adjusted.

(3) The cell configuration may be modified for use with substrates of various shapes. For example, the firebox 151 may enclose a rectangular volume with the outer walls 149 and the substrates 160 being flat. In the cylindrical configuration the surface area of the heat source is much smaller than that of the substrate, resulting in a significant reduction in power requirements. The substrates 160 may be stationary and contained entirely within the deposition chamber 81, which would alleviate any possible sealing problems. The outer wall 149 may be porous only in discrete areas for depositing diamond on matching discrete substrates. In addition, such discrete areas and the corresponding portions of the substrate holder 91 may be shaped for depositing diamond in the form of shaped bodies, such as domes. It is apparent that similar modifications could also be made to the other disclosed embodiments of the invention to adopt the transfer cells for particular applications.

Data needed to conduct the required optimizations as discussed above in paragraphs number 1 to 3 are shown in FIGS. 4 and 10 to 13 which show the relationship between the ambient pressure and the impact ratio of hydrogen on the surface. From FIG. 4 one can calculate the net disposition rate of carbon for selected conditions as a function of temperature and pressure. Some fraction of this deposition rate, typically 1/10, enters the growing diamond film. In order to burn the carbon solids other than diamond off the substrate, atomic hydrogen must impinge the surface. Estimates of a requirement to have a minimum of about 10 hydrogen atoms per carbon atom impacting the surface are the present state of the art for conventional diamond film deposition approaches. This ratio is indicated by the horizontal band in FIG. 10. This ratio, together with the data shown in FIG. 10, helps define the pressure and temperature range of the heater element. In order to achieve more relaxed operating tolerances, it is preferred to operate in the horizontal region of the curves of FIG. 10.

Furthermore, since the hydrogen in the gap is only partially dissociated by the temperature of the heater element, about 200 to 300 hydrogen molecules per carbon atom as well should impinge the surface of the substrate. The data illustrated in FIG. 11 combined with that shown in FIGS. 12 and 13 indicate the range of temperature and pressure in the transfer cell which must be used to ensure that this occurs. The horizontal band in FIG. 11 indicates the minimum ratio.

Figure 14:
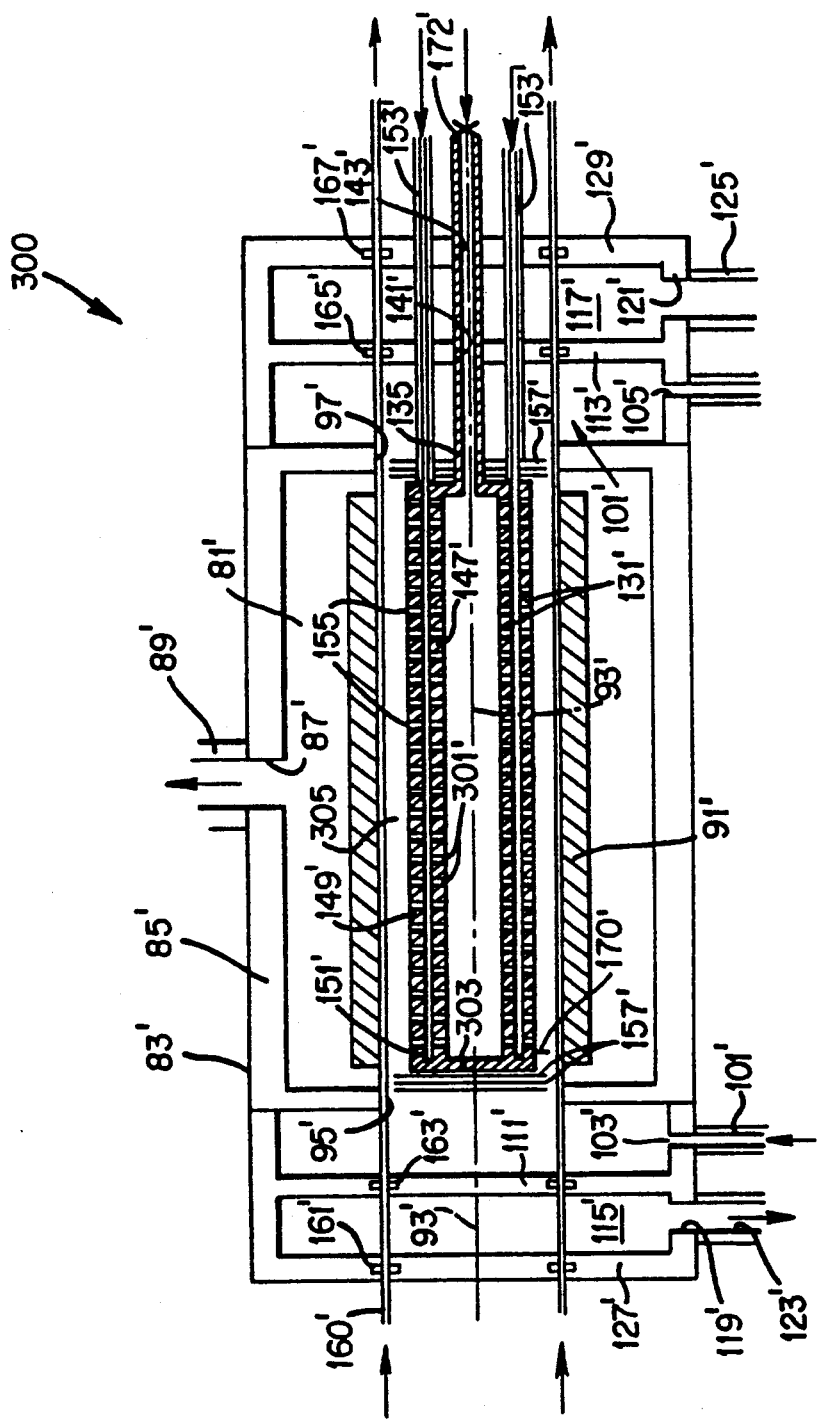
FIG. 14 is a schematical cross section of an embodiment of a transfer cell wherein combustion gases are used for diamond deposition.

With reference to FIG. 14, a further example of a transfer cell 300 is shown. The structure of the transfer cell 300 is, in many ways, similar to the structure of the transfer cell illustrated in FIG. 9 and like elements are numbered similarly, using primed reference numerals in FIG. 14.

The main structural differences between the embodiments of FIGS. 9 and 14 is that the embodiment of FIG. 14 includes a plurality of flow passages 301 in the inner surrounding wall 147' of the firebox 131' and that the end 301 of the central chamber 145' is closed. The passages 301 shown schematically in FIG. 14 may be either very fine through holes formed in the inner wall 147' or, preferably, the inner wall 147' may be formed of porous graphite.

Another important difference between the embodiments of FIGS. 9 and 14 is that the gas fed to the central chamber 145' is largely oxygen although, if desired, some hydrocarbon gas, preferably acetylene may be mixed with the oxygen. Also the gas fed to conduits 153' is preferably acetylene. The oxygen in the central chamber 145' flows through the flow passageways 301 into the annular chamber 151' where it mixes with the acetylene in the chamber 151' and at least partially combusts. In addition, if the gas input into the through conduit 135' into the central chamber is an oxygen rich mixture with acetylene, combustion also takes place in the central chamber 145'. An injection device (not shown) is provided to ignite the gasses. Depending on the pressures, temperatures and flow rates, a portion of the mixture of acetylene and oxygen may reach the outer surface of the outer wall 149' so that each exit of pore or flow passages 155' can act as a tiny oxyacetylene jet.

The gasses leaving the surface of the outer wall 149' include a mixture of the combustion products of acetylene with oxygen including carbon dioxide, carbon monoxide, water, in addition to acetylene. Additional hydrogen may be added to the system by mixing it with acetylene in conduits 153'. The oxygen supplied in the central chamber 145' via the hollow support 135' as controlled by the valve 172'. The temperature of the substrate 160' may be controlled by cooling means in the substrate holder 91' similar to that which is disclosed in the embodiment of FIG. 15.

Depending on the mixtures of gasses, combustion can take place in the central chamber 145' if an oxygen enriched mixture of acetylene and oxygen is supplied through the conduit 141', in the annular chamber 151', in the pores or fine holes 155' and at the openings of the pores or fine holes 155' at the outer surface of the outer graphite wall 149'. Depending on the pressure in the gap between the substrate 160' and the outer surface of the graphite wall 149', the transport of atoms and molecules between the facing surfaces may be in the kinetic regime or in the collision dominated regime. In either case diamond deposition occurs on the surface of the substrate 160' so long as the above discussed relationships between the carbon atoms emitted from the surface of the outer wall 149' prime and the surface substrate 160' prime (see FIG. 11) and the ratio of hydrogen atoms per carbon atom are maintained. As discussed above, this requires control of the temperatures of the outer surface of the outer wall 149' and the substrate 160', the pressure within the gap, and the hydrogen-carbon atom ratio in the gap.

Figure 15:
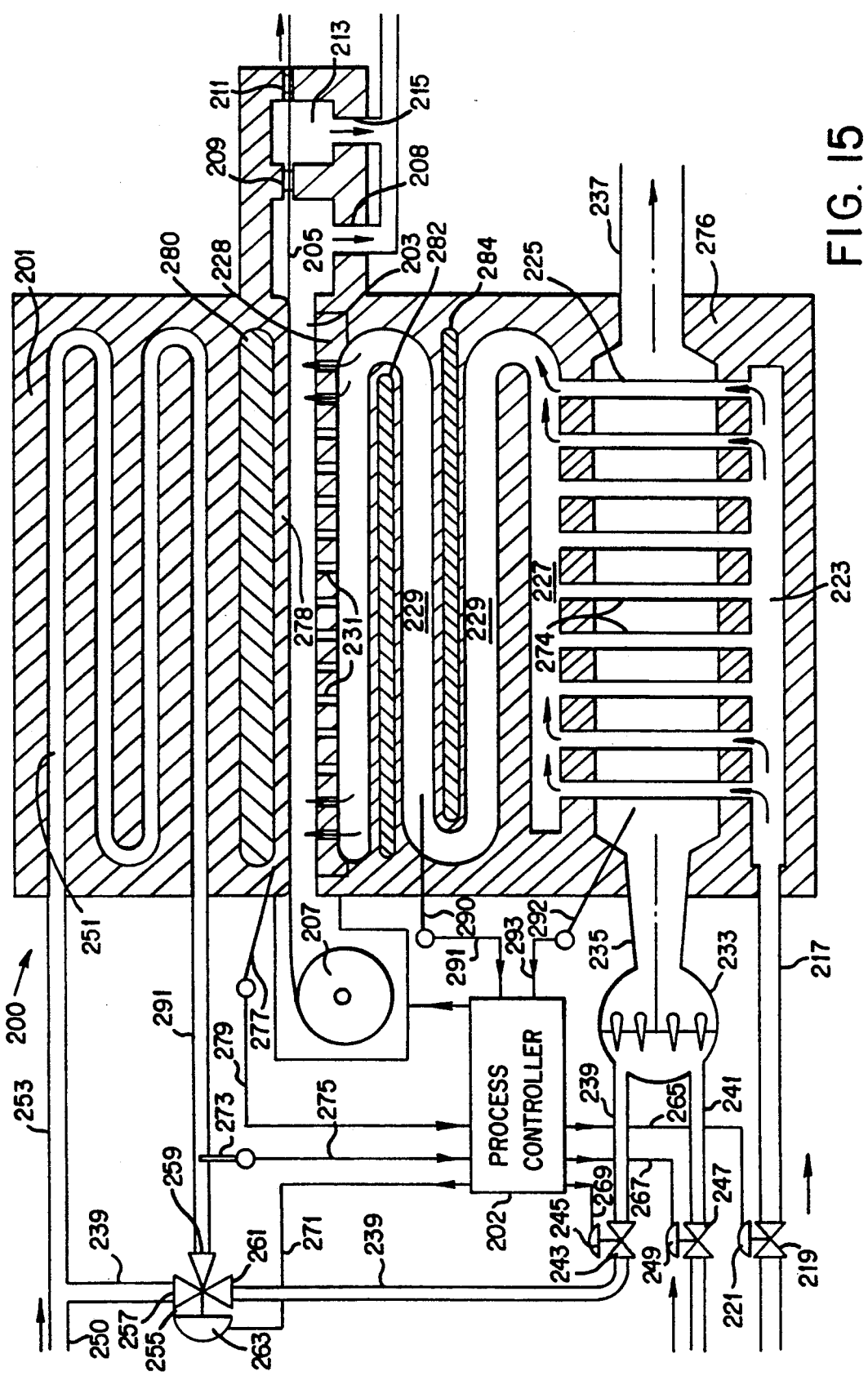
FIG. 15 shows a cross-sectional view through a fourth embodiment of diamond deposition cell.

With reference now to FIG. 15, a further embodiment of a transfer cell 200 includes a housing 201 having a deposition chamber 203 therein through which a substrate 205 is conveyed from a source 207 of the substrate, which may be a spool thereof, through the deposition chamber 203 and through feed through seals 209, 211. The chamber 203 is evacuated through a port 208 to maintain the integrity of the atmosphere within it. The chamber 213 is provided to further insure the integrity of the atmosphere in the deposition chamber 203 and is connected through a port 215 to a source of vacuum (not shown).

A conduit 217, controlled by a valve 219 having an actuator 221, supplies hydrogen or a mixture of hydrogen and hydrocarbon gas to the deposition chamber 203 via inlet manifold 223, heat exchanger 225, outlet manifold 227, tortuous passageway 229, and plurality of narrow openings or pores 231 in the graphite wall member 228.

The heat exchanger 225 is supplied with combustion gasses from a combustion chamber 233 via inlet conduit 235, and the gasses are exhausted from the heat exchanger via exhaust conduit 237. Supply conduits 239 and 241 supply the combustion chamber 233 with, respectively, fuel gas and oxygen or air. Flow of fuel gas to the combustion chamber 233 via the conduit 239 is controlled by valve 243 having actuator 245, while supply of oxygen or air to the combustion chamber 233 via the conduit 241 is controlled by the valve 247 having actuator 249.

The housing 201 includes a further tortuous passageway 251 which receives uncombusted fuel gas from a conduit 253 which branches off from the conduit 239 upstream of the combustion chamber 233. The uncombusted fuel gas flows through the tortuous passageway 251 in the housing 201 for temperature control purposes whereafter the fuel gas is returned to the conduit 239 via 3-way valve 255 having inlets 257, 259 and single outlet 261, which are controlled by an actuator 263.

A process controller 202, which preferably includes a microprocessor, is provided to receive and process signals from sensors in the housing 201 for controlling the operation of the system. The respective actuators 221, 249, 245 and 263 of the respective valves 219, 247, 243 and 255 comprise electrical actuators which are controlled by the process controller via the respective control wires 265, 267, 269 and 271.

The conduit 251 has a temperature sensor 273 therein which communicates the temperature of the uncombusted fuel gas within the conduit 251 to the process controller 202 via the wire 275. The temperature sensor 277 is incorporated into the housing 201 at a location allowing the sensing of the temperature thereof adjacent the isothermal mass 280 therein. The temperature sensor 277 is connected to the process controller 202 via the line 279. Additional isothermal masses 282 and 284 are provided within the tortuous passageway 229. The isothermal masses 280, 282 and 284 are provided of materials having melting points close to or at the desired temperature for the adjacent surfaces. The isothermal mass 280 may be made of a material chosen from Table A whereas the isothermal masses 282, 284 may be chosen from the materials listed in Table C.

The temperature sensor 290 senses the temperature within the torturous passageway 229 which is reflective of the temperature of the isothermal masses 282, 284 and communicates this information to the process controller via the sensing line 291. The temperature sensor 292 senses the temperature within heat exchanger 225 and communicates this information to the process controller 222 via the sensing line 293. The portion of the housing 201 adjacent to heat exchanger 225 comprises a graphite reactor component similar to that which is designated by the reference numeral 85 in FIG. 9 and which reacts with any hydrogen gas in the combusted fuel in order to increase pumping efficiency.

In the operation of the embodiment of FIG. 15, the fuel in the conduit 253 is regeneratively heated by conveying it through tortuous passageway 251 in the housing 201 wherein heat flowing away from the substrate holder 278 heats the fuel within the tortuous passageway 251. Fuel and oxidizers are injected into the combustion chamber 233 from the conduits 239 and 241 and the combustion products thereof are conveyed to the heat exchanger 225 where they heat the graphite reactor component 276 to the desired degree. The temperature of the graphite component 276 is stabilized at the desired temperature such as, for example, 2,500° K., through the use of the isothermal masses 282 and 284.

The hydrogen or hydrogen/hydrocarbon mixture used for depositing the diamond film on the substrate 205 is regeneratively heated in the high temperature component by passing it through conduit 274 in the heat exchanger 225 and the tortuous passageway 229 and out the holes 231 into the deposition chamber 203.

The major power transfers leading to power loss occurs between the high temperature graphite reactor component 276 and the substrate 205. This power transfer occurs by a number of mechanisms:

(1) Radiation from the hot graphite reactor component to the substrate;

(2) Heat carried by the gas from the hot graphite reactor component to the substrate;

(3) Chemical reactions on the substrate which may generate heat, for example, hydrogen atoms joining to form hydrogen molecules;

(4) The heat transferred to the substrate/substrate holder which may flow into the following:

(a) Some heat is utilized to regeneratively heat the fuel which flows through the tortuous passageway 251;

(b) Some heat may be used to preheat the substrate 205;

(c) Most of the remainder of the heat is rejected or used for some other useful purpose such as, for example, heating of living areas.

As the device 200 operates, the process controller receives input from the temperature sensors 273, 277, 290, 292 and responsive to information gathered from these inputs, controls the operation of (1) the valves 247 and 243 to adjust the mixture of fuel and oxygen of air supplied to the combustion gasses, (2) the valve 219 to control the rate of flow of hydrogen or hydrocarbon gas to the deposition chamber, and (3) the valve 255 to control the amount of fuel gas which is by-passed through the tortuous passageway 251 to perform regenerative cooling and heating operations.

In the operation of the transfer cell of FIG. 15 fuel supplied through conduit 239 and oxidizer supplied through conduit 241 is burned in combustor 233. The hot gasses from the combustor are passed through the heat exchanger 225 to heat the graphite portion 276 of the housing 201 and the hydrogen or mixed hydrogen and hydrocarbon gas passing through the heat exchanger 225 from conduit 217 to serpentine conduit 229. The temperature of the graphite component 276 is stabilized at a selected temperature preferably in the range of 2,000° K. to 2,700° K. by the isothermal masses 282 and 284, and the substrate is maintained at a selected temperature, preferably in the range 700° K. to 1,400° K., by the isothermal mass 280. The criteria determining relationship between these temperatures is the same as was discussed above with relation to the other embodiments.

What is claimed is:

1. A method for depositing diamond on a surface of a substrate comprising the steps of:

positioning said surface of said substrate within a preselected distance from the surface of a carbon containing heater element such that the gap between said surfaces is less than about 10 times the mean free path of hydrogen atoms in said gap at all points on said surface of said substrate on which diamond is to be deposited;

maintaining the portion of said surface of said heater element which is within said preselected distance from said surface of said substrate at a substantially uniform, selected, relatively high temperature;

introducing a hydrogen containing gas at a preselected pressure in the gap between said substrate and said surface; and maintaining the surface of said substrate proximate said heater element surface at a substantially uniform selected, relatively low temperature such that the gas at the surface of said substrate is slightly supersaturated with carbon and the emission or return rate for carbon atoms from said surface of said heater element is higher than from said surface of said substrate, such that diamond is deposited on said substrate.

2. A method for depositing diamond on a substrate comprising the steps of:

positioning said substrate proximate a carbon containing surface, said surface being shaped such that a substantially uniform gap exists between the portion of said substrate on which diamond is to be deposited and said surface;

introducing hydrogen into the gap at a selected pressure; and maintaining said surface at a substantially uniform selected temperature above 1,800° K. and said substrate at a substantially uniform selected temperature less than 1,500° K., such that the ambient at the surface of said substrate is slightly supersaturated with carbon and the emission or return rate for carbon atoms from said surface is higher than from said substrate, such that diamond is deposited on said substrate.

3. The method of claim 2 wherein the width of said gap is less than about 10 times the mean from path of hydrogen atoms in said gap.

4. The method of claim 2 wherein hydrogen is introduced into said gap by diffusing it through a porous graphite wall to said surface, said surface forming a part of said wall.

5. The method of claim 2 wherein the temperatures of said substrate and said surface and said pressure are maintained at levels such that polycrystalline diamond is deposited on said substrate.

6. The method of claim 2 wherein the temperatures of said substrate and said surface and said pressure are maintained at levels such that hydrogenated diamond is deposited on said substrate.

7. The method of claim 2 wherein the temperatures of said substrate and said surface and said pressure are maintained at levels such that diamond like carbon is deposited on said substrate.

8. The method of claim 2 further including the step of introducing hydrocarbon gas in the gap.

9. The method of claim 4 further including the step of mixing hydrocarbon gas with the hydrogen prior to diffusing the mixed gases through said porous graphite wall.

10. The method of claim 2 further including introducing hydrocarbon gas into said gap at a ratio with the hydrogen such that the ratio of atomic hydrogen atoms to carbon atoms impinging said substrate is at least 10-1.

11. The method of claim 9 further including the step of conducting the mixed gasses to the side of said wall opposite said surface at a pressure high enough to prevent substantial plating out of carbon from such mixed gasses until after said gasses reach said surface.

12. The method of claim 2 wherein said carbon surface is constituted by a surface of a graphite wall and said surface is maintained at a temperature above about 1,800° K. by combusting a gas in a fire box adjacent the other side of said wall.

13. The method of claim 2 wherein said graphite wall is porous and said gas includes a hydrocarbon gas and oxygen and wherein the products of combustion of said hydrocarbon gas are diffused to said surface for supplying carbon to be deposited on said substrate as diamond.

14. The method of claim 2 wherein said carbon surface is a surface of a porous graphite wall and further including the step of diffusing a hydrocarbon gas through said wall to said surface for supplying carbon to be deposited as diamond on said substrate.

15. The method of claim 14 further including the step of maintaining said hydrocarbon gas at sufficiently high pressure to substantially prevent plating out of carbon from said hydrocarbon until after said gas reaches said surface.

16. The method of claim 15 further including the step of mixing oxygen to said hydrocarbon gas.

17. The method of claim 3 wherein said hydrogen is introduced into said gap by diffusing it through a porous graphite wall to said surface, said surface forming a part of said wall.

18. The method of claim 3 further including the step of introducing hydrocarbon gas in the gap.

19. The method of claim 9 wherein the width of said gap is less than 10 times the mean free path of hydrogen atoms in the gap.

20. The method of claim 3 further including introducing hydrocarbon gas into said gap at a ratio with the hydrogen such that the ratio of atomic hydrogen atoms to carbon atoms impinging said substrate is at least 10-1.

21. The method of claim 3 wherein said carbon surface is constituted by a surface of a graphite wall and said surface is maintained at a temperature above about 1,800° K. by combusting a gas in a fire box adjacent the other side of said wall.

22. The method of claim 21 wherein said graphite wall is porous and said gas includes a hydrocarbon gas and oxygen and wherein said the products of combustion of said hydrocarbon gas are diffused to said surface for supplying carbon to be deposited in said substrate as diamond.

23. The method of claim 2 wherein the step of maintaining said substrate at a selected temperature includes maintaining said substrate in thermal contact with a material having a melting point at or close to such selected substrate temperature.

24. The method of claim 2 wherein the selected temperature of said substrate is between 700° to 1,400° K.

25. The method of claim 3 wherein the selected temperature of said substrate is between 700° to 1,400° K.

26. The method of claim 2 further including providing a porous graphite reactor maintained at a temperature in the range of about 700° to 900° K. for reacting with said hydrogen to convert it into a hydrocarbon.

27. The method of claim 2 wherein the width of said gap is less than 5 times the mean free path of hydrogen atoms in the gap.

28. The method of claim 3 wherein the width of said gap is less than 5 times the mean free path of hydrogen atoms in the gap.

29. The method of claim 1 wherein said heater element is heated by chemical energy.

30. The method of claim 2 wherein said carbon containing surface is heated by chemical energy.

31. The method of claim 1 wherein said deposition of diamond takes place within a deposition chamber and further including the step of:
exhausting hydrogen from the gap by reacting at least a portion of the hydrogen in said chamber with a porous graphite reactor for converting said hydrogen to a hydrocarbon gas; and
pumping such hydrocarbon gas from said chamber.

32. The method of claim 2 wherein said deposition of diamond takes place within a deposition chamber and further including the step of:
exhausting hydrogen from the gap by reacting at least a portion of the hydrogen in said chamber with a porous graphite reaction for converting said hydrogen to a hydrocarbon gas; and
pumping such hydrocarbon gas from said chamber.

* * * * *